US010649007B2

(12) United States Patent
Stachowiak, Jr.

(10) Patent No.: US 10,649,007 B2
(45) Date of Patent: May 12, 2020

(54) APPARATUS AND METHOD FOR SECURING AN ENCLOSURE

(75) Inventor: John Edward Stachowiak, Jr., Houston, TX (US)

(73) Assignee: DeWalch Technologies, Inc., Houston, TX (US)

( * ) Notice: Subject to any disclaimer, the term of this patent is extended or adjusted under 35 U.S.C. 154(b) by 0 days.

(21) Appl. No.: 12/378,879

(22) Filed: Feb. 20, 2009

(65) Prior Publication Data

US 2010/0044099 A1 Feb. 25, 2010

Related U.S. Application Data

(63) Continuation of application No. 11/705,653, filed on Feb. 12, 2007, now abandoned, which is a
(Continued)

(51) Int. Cl.
*H02G 3/08* (2006.01)
*B65D 55/14* (2006.01)
(Continued)

(52) U.S. Cl.
CPC ............... *G01R 3/00* (2013.01); *G01R 11/04* (2013.01); *G01R 11/24* (2013.01); *H05K 5/0221* (2013.01);
(Continued)

(58) Field of Classification Search
CPC .......... H05K 5/0221; H05K 5/00; H05K 5/02; H05K 5/04; H05K 5/0208; H05K 5/0217;
(Continued)

(56) References Cited

U.S. PATENT DOCUMENTS 1,177,728 A 4/1916 Synder
1,241,459 A 9/1917 Woodard
(Continued)

FOREIGN PATENT DOCUMENTS

MX 255806 3/2008
MX 288892 8/2011
(Continued)

OTHER PUBLICATIONS

Mexican Institute of Industrial Property (MIIP) Office Action per Letter dated Oct. 11, 2007 from Foreign Counsel (Becerril, Coca & Becerril) (for related Mexican Application No. PA/A/2004/012315 filed Dec. 8, 2004) (3 Pages).
(Continued)

*Primary Examiner* — Angel R Estrada
(74) *Attorney, Agent, or Firm* — DeWalch Technologies, Inc.

(57) ABSTRACT

The present invention relates to an apparatus and method for securing a box cover to a watthour meter socket box. In certain embodiments, the apparatus has a clamping member that fits over a wall of a meter box, and a lock housing that locks to the clamping member after a box cover has been installed, thereby securing the cover to the box in a manner such that the box cover cannot be installed unless the clamping member has been installed correctly. In various other embodiments, the clamping member consists of a clamp disposed between a clamp actuating member and a fastening shelf. In various other embodiments, the clamp includes a stopping member for indicating when the clamp actuating member is actuated into a fully secured position. Other embodiments relate to a locking bracket and a lock housing wherein the locking bracket generally comprises a clamping member and a fastening lever that attaches to a wall of a meter box base. The lock housing generally
(Continued)

comprises a unitary member with a perpendicular flange. The meter box lid is secured to the meter box base when the locking bracket is secured to the side wall (or another wall) and used in combination with the lock housing and a locking shaft.

24 Claims, 15 Drawing Sheets

Related U.S. Application Data continuation-in-part of application No. 10/823,285, filed on Apr. 13, 2004, now Pat. No. 7,176,376, and a continuation-in-part of application No. 11/434,665, filed on May 16, 2006, now abandoned, which is a continuation-in-part of application No. PCT/US2006/018783, filed on May 16, 2006.

(60) Provisional application No. 60/681,200, filed on May 16, 2005, provisional application No. 60/793,104, filed on Apr. 19, 2006.

(51) Int. Cl.
*B23P 11/00* (2006.01)
*G01R 3/00* (2006.01)
*G01R 11/04* (2006.01)
*G01R 11/24* (2006.01)
*H05K 5/02* (2006.01)

(52) U.S. Cl.
CPC .... *Y10T 29/49826* (2015.01); *Y10T 29/49947* (2015.01); *Y10T 29/53* (2015.01)

(58) Field of Classification Search
CPC ............... Y10T 29/49947; Y10T 29/53; Y10T 29/49826; G01R 3/00; G01R 11/04; G01R 11/24; H02G 3/08; H02G 3/081; B65D 55/14; B23P 11/00
USPC ......... 174/480, 481, 50, 53, 135, 58, 38, 57; 70/2, 6–14, 158–173, 370, 386, 77, 63, 70/451, 466; 248/906, 551, 552, 553; 439/535, 536; 220/3.2, 3.3, 3.8, 4.02; 292/281, 282; 361/600, 601, 659, 672
See application file for complete search history.

(56) References Cited

U.S. PATENT DOCUMENTS

| | | | |
|---|---|---|---|
| 2,121,386 | A | 6/1938 | Henrickson |
| 4,080,811 | A | 3/1978 | Nielsen |
| 4,144,729 | A | 3/1979 | Nielsen, Jr. |
| 4,414,829 | A | 11/1983 | Nielsen, Jr. |
| 5,157,409 | A | 10/1992 | Hamin |
| 5,315,849 | A | 5/1994 | Georgopoulos |
| 6,684,670 | B1 | 2/2004 | Agbay et al. |
| 6,742,365 | B1 * | 6/2004 | Sullivan et al. ...................... 70/2 |
| 6,763,691 | B1 * | 7/2004 | Rafferty ......................... 70/164 |
| 6,931,893 | B2 * | 8/2005 | Agbay ................................ 70/2 |
| 6,976,373 | B1 * | 12/2005 | Sullivan et al. ..................... 70/2 |
| 7,021,090 | B1 * | 4/2006 | Nolle et al. .......................... 70/2 |
| 7,176,376 | B2 * | 2/2007 | Stachowiak, Jr. ............... 174/50 |
| 7,377,134 | B1 * | 5/2008 | Sullivan et al. ..................... 70/2 |
| 7,448,235 | B2 | 11/2008 | Ely et al. |
| 2005/0224250 | A1 | 10/2005 | Stachowiak |
| 2007/0205012 | A1 | 9/2007 | Stachowiak |

FOREIGN PATENT DOCUMENTS

| | | |
|---|---|---|
| MX | 307878 | 3/2013 |
| MX | 2015/006728 | 5/2015 |
| WO | 2014084184 | 6/2014 |

OTHER PUBLICATIONS

Applicants MIIP Office Action Response dated Dec. 21, 2007 (for related Mexican Application No. PA/A/2004/012315 filed Dec. 8, 2004) (30 Pages).
Notice of Allowance from the MIIP per Letter dated Feb. 15, 2008 from Foreign Counsel (Becerril, Coca & Becerril) (for related Mexican Application No. PA/A/2004/012315 filed Dec. 8, 2004) (1 Page).
Mexican Institute of Industrial Property (MIIP) Office Action per Letter dated Jul. 12, 2012 from Foreign Counsel (Becerril, Coca & Becerril) (for related Mexican Application No. MX/A/2011/008120) (Three (3) Pages).
Applicant's e-mail and attached MIIP Office Action Response dated Oct. 15, 2012 (for related Mexican Application No. MX/A/2011/008120 (Eleven (11) Pages).
Notice of Allowance from the MIIP per Letter dated May 2, 2011 from Foreign Counsel, Mexican Patent Application No. MX/A/20081000365 (3 pages).
Notice of Allowance issued by the USPTO dated Aug. 11, 2006, U.S. Appl. No. 10/823,285 (7 pages).
Amendment after Notice of Allowance issued by the USPTO dated Aug. 11, 2006, U.S. Appl. No. 10/823,285 (23 pages).
Notice of Allowance from the MIIP per Letter dated Nov. 15, 2012 from Foreign Counsel, Mexican Patent Application No.: MX/A/2011/008120 (2 pages).
Letter from Foreign Counsel dated Mar. 27, 2013 confirming payment of issue fee and annuity tax to MIIP in connection with Mexican Patent Application No.: MX/A/2011/008120 (8 pages).
Letter from Foreign Counsel dated Jul. 30, 2013 regarding Letters Patents for Mexican Patent No. 307878 in connection with Mexican Patent Application No.: MX/A/2011/008120 (1 page).
IURPA Brochure, vol. 13, Issue 1, dated Oct. 2002, Cover page, p. 10 —"Jiffy Lock" (2 pages).
Bibliographic Data Sheets—for U.S. Appl. No. 10/823,285 filed Apr. 13, 2004 (2 pages).
Bibliographic Data Sheet—for U.S. Appl. No. 11/705,653 filed Feb. 12, 2007 (1 page).
Bibliographic Data Sheets—U.S. Appl. No. 12/378,879 filed Feb. 20, 2009 (5 pages).
Bibliographic Data Sheet—U.S. Appl. No. 11/434,665 filed May 16, 2006 (1 page).
Bibliographic Data Sheets—U.S. Appl. No. 12/317,086 filed Dec. 20, 2008 (3 pages).
Bibliographic Data Sheets—for PCT Application No. PCT/US06/18783 filed May 6, 2006 (1 page).
Bibliographic Data Sheets—for U.S. Appl. No. 11/920,593 filed Nov. 16, 2007 (3 pages).
Ad/Brochure/etc. —Brooks, Seals & Locking Devices for Electric Utility Companies, (1999) (pp. 1-8; and see pp. 5 and 7)*—*Information unclear regarding content and date (No admission is being made regarding applicability or otherwise and as per IDS Statement Submitted May 26, 2015) (8 pages).
Ad/Brochure/etc. —International Utilities Revenue Protection Association (Oct. 2002) Bullseye Ringless Meter-Locks, etc. (2nd page (indicated as page 2)), Jiffy Lock (3rd page (indicated as p. 10)*—*Information unclear regarding content and date (No admission is being made regarding applicability or otherwise and as per IDS Statement Submitted May 26, 2015) (3 pages).
Ad/Brochure/etc. —International Utilities Revenue Protection Association (Apr. 2003) Sidewinder Locks, Bullseye Ringless Meter-Locks, etc. (2nd page), Jiffy Lock (3rd page)*—*Information unclear regarding content and date (No admission is being made regarding applicability or otherwise and as per IDS Statement Submitted May 26, 2015) (3 pages).
Ad/Brochure/etc. —Brooks, Utility Products Group (2004) (1st page), Hex Guard, Hex Guard II, Armor Guard and Super Armor Guard, etc. (7th and 8th pages)*—*Information unclear regarding content and date (No admission is being made regarding applicability or otherwise and as per IDS Statement Submitted May 26, 2015) (12 pages).

(56) References Cited

OTHER PUBLICATIONS

Ad/Brochure/etc. —Brooks, Utility Products Group Problem Solvers (2004) New Quik Lock, etc. (1st and 2nd pp.)*—*Information unclear regarding content and date (No admission is being made regarding applicability or otherwise and as per IDS Statement Submitted May 26, 2015) (2 pages).
Bibliographic Data Sheets for following Application No. PCT/US12/66687; ISR/WO; (23 pages).
Office Action dated Mar. 24, 2010 including Notice of References Cited in connection with U.S. Appl. No. 112/317,086 (11 pages).
Foreign Correspondence in Mexico—MX Application Filing Related to PCT (18 pages).
Trial Brief—In the U.S. District Court, District of Massachussetts—Defendant DeWalch Technologies, Inc.'s Trial Brief dated Feb. 6, 2008 (37 pages)*—*(No admission is being made regarding applicability, relevancy, materiality or otherwise and as per IDS Statement Submitted Sep. 2, 2016).
Trial Brief—In the U.S. District Court, District of Massachussetts—Plaintiff's Trial Brief dated Feb. 6, 2008 (21 pages)*—*(No Admission is being made regarding applicability, relevancy, materiality or otherwise and as per IDS Statement Submitted Sep. 2, 2016).
International Preliminary Report on Patentability dated Mar. 24, 2015 for International Application No. PCT/US2012/066687 filed Nov. 27, 2012* (7 pages)—*(No admission is being made regarding applicability, relevancy, materiality or otherwise and as per IDS Statement Submitted Sep. 2, 2016).
Office Action dated Sep. 9, 2015 regarding related U.S. Appl. No. 13/841,319 (14 pages)*—*(No admission is being made regarding applicability, relevancy, materiality or otherwise and as per IDS Statement Submitted May 1, 2017).
Office Action Response dated Mar. 9, 2016 regarding related U.S. Appl. No. 13/841,319 (20 pages)*—*(No admission is being made regarding applicability, relevancy, materiality or otherwise and as per IDS Statement Submitted May 1, 2017).
Correspondence between Foreign Counsel and Applicant dated May 31, 2018 regarding related to MX Application No. MX/a/2015/006728 (13 pages)*—*(No admission is being made regarding applicability, relevancy, materiality or otherwise and as per IDS Statement Submitted herewith).
Correspondence between Foreign Counsel and Applicant dated Jun. 12, 2018 regarding related to MX Application No. MX/a/2015/006728 (15 pages)*13 *(No admission is being made regarding applicability, relevancy, materiality or otherwise and as per IDS Statement Submitted herewith).
Correspondence between Foreign Counsel and Applicant dated Jun. 13, 2018 regarding related to MX Application No. MX/a/2015/006728 (4 pages)*—*(No admission is being made regarding applicability, relevancy, materiality or otherwise and as per IDS Statement Submitted herewith).
Office Action dated Sep. 5, 2017 regarding related U.S. Appl. No. 13/841,319 (20 pages)*—*(No admission is being made regarding applicability, relevancy, materiality or otherwise and as per IDS Statement Submitted herewith).
Office Action Response dated Oct. 5, 2017 and Feb. 5, 2018 regarding related U.S. Appl. No. 13/841,319 (17 pages)*—*(No admission is being made regarding applicability, relevancy, materiality or otherwise and as per IDS Statement Submitted herewith).
Bibliographic Data Sheet in connection with (PAT-027 CIP1A) related U.S. Appl. No. 13/839,710 (5 pages).
Notice of References Cited (Patents/Applications/Other) by Examiner and Office Action dated Oct. 5, 2015 in connection with (PAT-027 CIP1A) U.S. Appl. No. 13/839,710 (7 pages).
Response to Office Action dated Apr. 5, 2016 in connection with (PAT-027 CIP1A) U.S. Appl. No. 13/839,710 (17 pages).
Notice of References Cited (Patents/Applications/Other) by Examiner and Notice of Allowance dated May 26, 2016 in connection with (PAT-027 CIP1A) U.S. Appl. No. 13/839,710 (8 pages).
Request for Continued Examination dated Aug. 26, 2016 in connection with (PAT-027 CIP1A) U.S. Appl. No. 13/839,710 (43 pages).
Notice of Allowance dated Feb. 8, 2017 in connection with (PAT-027 CIP1A) U.S. Appl. No. 13/839,710 (8 pages).
Request for Continued Examination dated May 8, 2017 in connection with (PAT-027 CIP1A) U.S. Appl. No. 13/839,710 (76).
Notice of Allowance dated Oct. 16, 2017 in connection with (PAT-027 CIP1A) U.S. Appl. No. 13/839,710 (14 pages).
Request for Continued Examination dated Jan. 16, 2018 in connection with (PAT-027 CIP1A) U.S. Appl. No. 13/839,710 (46 pages).
Notice of Allowance dated Jul. 9, 2018 in connection with (PAT-027 CIP1A) U.S. Appl. No. 13/839,710 (9 pages).
Request for Continued Examination dated Oct. 9, 2018 in connection with (PAT-027 CIP1A) U.S. Appl. No. 13/839,710 (199 pages).
Notice of Allowance dated May 21, 2019 in connection with (PAT-027 CIP1A) U.S. Appl. No. 13/839,710 (15 pages).
Request for Continued Examination with IDS submitted dated Aug. 21, 2019 in connection with (PAT-027 CIP1A) U.S. Appl. No. 13/839,710 (286 pages).
Request for Continued Examination with Amendment submitted dated Aug. 5, 2019 in connection with (PAT-027 CIPB) with U.S. Appl. No. 13/841,319 (27 pages).
Ad/Brochure/etc. —Inner-Tite, Innovative Revenue Protection Solutions (2011) (1 page)*—*(This information shows a date which is after the filing date of the above-referenced application; no admission is being made regarding applicability, relevancy, materiality or otherwise and as per IDS Statement Submitted herewith).
Ad/Brochure/etc.—EJ Brooks, Quick Lock II (2014) (2 pages)*—*(This information shows a date which is after the filing date of the above-referenced application; no admission is being made regarding applicability, relevancy, materiality or otherwise and as per IDS Statement Submitted herewith).
Ad/Brochure/etc.—Highfield, Lock in Protection for your Smart Meters (8 pages)*—*Information unclear regarding content and date (No admission is being made regarding applicability, relevancy, materiality or otherwise and as per IDS Statement Submitted herewith).
Ad/Brochure/etc.—Highfield, Speedy Global Mount (3 pages)*—*Information unclear regarding content and date (No admission is being made regarding applicability, relevancy, materiality or otherwise and as per IDS Statement Submitted herewith).
ISR and written Opinion for International Application No. PCT/US2012/066687 filed Nov. 27, 2010 (10 pages).
Response to Invitation to Correct Defects of Dec. 5, 2012 dated Mar. 5, 2013 for International Application No. PCT/US2012/066687 filed Nov. 27, 2012 (30 pages).
Notification of Decision Concerning Request for Rectification dated Mar. 11, 2013 for International Application No. PCT/US2012/066687 filed Nov. 27, 2012 (2 pages).
Bibliographic Data Sheet for related U.S. Appl. No. 10/823,285 filed Apr. 13, 2004 (2 pages).
Information Disclosure Statement (IDS) submitted dated Jul. 19, 2004 for related U.S. Appl. No. 10/823,285 (4 pages).
Notice of References Cited (Patents/Applications/Other) by Examiner and Notice of Allowance dated Mar. 9, 2005 for related U.S. Appl. No. 10/823,285 (3 pages).
Request for Continued Examination (RCE) with IDS dated Mar. 18, 2005 for related U.S. Appl. No. 10/823,285 (4 pages).
Notice of Allowance dated Aug. 19, 2005 for related U.S. Appl. No. 10/823,285 (2 pages).
Non-Final Rejection dated Jan. 25, 2006 for related U.S. Appl. No. 10/823,285 (10 pages).
Applicant's Amendment dated Jul. 25, 2006 for related U.S. Appl. No. 10/823,285 (13 pages).
Notice of Allowance dated Aug. 11, 2006 for related U.S. Appl. No. 10/823,285 (7 pages).
Amendment after Notice of Allowance dated Nov. 10, 2006 for related U.S. Appl. No. 10/823,285 (23 pages).
Amendment After Final, initiated by the Examiner dated Dec. 6, 2006 for related U.S. Appl. No. 10/823,285 (7 pages).
Issue Notification dated Jan. 24, 2007 for related U.S. Appl. No. 10/823,285 (1 pages).
In connection with (PAT-027 CIP) for related U.S. Appl. No. 11/705,653 filed Feb. 12, 2007 (1 page).

(56) References Cited

OTHER PUBLICATIONS

Notice of References Cited (Patents/Applications/Other) by Examiner and Non-Final Rejection dated Nov. 1, 2007 in connection with (PAT-027 CIP) for related U.S. Appl. No. 11/705,653 (5 pages).
Response to Office Action dated May 1, 2008 in connection with (PAT-027 CIP) for related U.S. Appl. No. 11/705,653 (12 pages).
Notice of References Cited (Patents/Applications/Other) by Examiner and Final Office Action dated Aug. 20, 2008 in connection with (PAT-027 CIP) for related U.S. Appl. No. 11/705,653 (11 pages).
Abandonment dated Mar. 24, 2009 in connection with (PAT-027 CIP) for related U.S. Appl. No. 11/705,653 (3 pages).
Office Action (Restriction) dated Mar. 23, 2015 in connection with U.S. Appl. No. 13/841,319 (7 pages).
Response to Office Action (Restriction) dated Aug. 24, 2015 in connection with U.S. Appl. No. 13/841,319 (14 pages).
Office Action dated Sep. 9, 2015 in connection with U.S. Appl. No. 13/841,319 (14 pages).
Response to Office Action dated Mar. 9, 2016 in connection with U.S. Appl. No. 13/841,319 (20 pages).
Final Office Action dated Apr. 27, 2016 in connection with U.S. Appl. No. 13/841,319 (16 pages).
Request for Continued Examination dated Oct. 27, 2016 in connection with U.S. Appl. No. 13/841,319 (24 pages).
Office Action dated Mar. 23, 2017 in connection with U.S. Appl. No. 13/841,319 (16 pages).
Response to Office Action dated Jul. 24, 2017 in connection with U.S. Appl. No. 13/841,319 (22 pages).
Final Office Action dated Sep. 5, 2017 in connection with U.S. Appl. No. 13/841,319 (20 pages).
Applicant Summary of Interview with Examiner dated Oct. 5, 2017 in connection with U.S. Appl. No, 13/841,319 (5 pages).
Office Action dated Jul. 10, 2018 in connection with U.S. Appl. No. 13/841,319 (26 pages).
Non-Final Office Action dated Jul. 10, 2018 in connection with related U.S. Appl. No. 13/841,319 (17 pages).
Response to Office Action dated Jan. 10, 2019 in connection with U.S. Appl. No. 13/841,319 (16 pages).
Final Office Action dated Feb. 4, 2019 in connection with U.S. Appl. No. 13/841,319 (25 pages).
Applicant Summary of Interview with Examiner dated Jun. 13, 2019 in connection with U.S. Appl. No. 13/841,319 (2 pages).
Mexican Institute of Industrial Property (MIIP) Office Action per Letter dated May 27, 2010 from Foreign Counsel (Becerril, Coca & Becerril) (for related Mexican Application No. MX/A/2008/000365) (11 Pages).
Response to Mexican Institute of Industrial Property (MIIP) Office Action per Letter dated Sep. 10, 2010 to Foreign Counsel (Becerril, Coca & Becerril) (for related Mexican Application No. MX/A/2008/000365) (18 pages).
Filing Report confirming Response filed to Mexican Institute of Industrial Property (MIIP) Office Action per Letter dated Sep. 22, 2010 from Foreign Counsel (Becerril, Coca & Becerril) (for related Mexican Application No. MX/A/2008/000365) (11 pages).
Mexican Institute of Industrial Property (MIIP) Office Action per Letter dated Jan. 24, 2011 from Foreign Counsel (Becerril, Coca & Becerril) (for related Mexican Application No. MX/A/2008/000365) (7 pages).
Response to Mexican Institute of Industrial Property (MIIP) Office Action per letter dated Feb. 25, 2011 to Foreign Counsel (Becerril, Coca & Becerril) (for related Mexican Application No. MX/A/2008/000365) (5 pages).
Further communication to Response to Mexican Institute of Industrial Property (MIIP) Office Action per letter dated Feb. 25, 2011 to Foreign Counsel (Becerril, Coca & Becerril) (for related Mexican Application No. MX/A/2008/000365) (5 pages).
Filing Report and Response to Mexican Institute of Industrial Property (MIIP) Office Action per Letter dated Mar. 14, 2011 from Foreign Counsel (Becerril, Coca & Becerril) (for related Mexican Application No. MX/A/2008/000365) (11 pages).
Letter dated May 2, 2011 from Foreign Counsel (Becerril, Coca & Becerril) confirming Notice of Allowance (for related Mexican Application No. MX/A/2008/000365) (2 Page).
Letter dated Aug. 29, 2011 from Foreign Counsel confirming payment of Issue Fee (Becerril, Coca & Becerril) (for related Mexican Application No. MX/A/2008/000365) (1 Page).
Letter dated Dec. 13, 2011 from Foreign Counsel with attached Letters Patent (Becerril, Coca & Becerril) (for related Mexican Application No. MX/A/2008/000365) (1 Page).
Letter from Foreign Counsel (Becerril, Coca & Becerril) dated May 19, 2016 with publication in connection with Mexican Patent Application No.: MX/A/2015/006728 (7 pages).
Mexican Institute of Industrial Property (Miip) Office Action per Letter dated Feb. 28, 2018 from Foreign Counsel (Becerril, Coca & Becerril) (for related Mexican Application No. MX/A/2015/006728) (2 pages).
Response to Mexican Institute of Industrial Property (MIIP) Office Action per Letter dated Jun. 13, 2018 to Foreign Counsel (Becerril, Coca & Becerril) (for related Mexican Application No. MX/A/2015/006728) (18 pages).
Filing Report and Response to Mexican Institute of Industrial Property (MIIP) Office Action per Letter dated Jun. 22, 2018 from Foreign Counsel (Becerril, Coca & Becerril) (for related Mexican Application No. MX/A/2015/006728) (10 pages).
Mexican Institute of Industrial Property (MIIP) Office Action per Letter dated Nov. 8, 2018 from Foreign Counsel (Becerril, Coca & Becerril) (for related Mexican Application No. MX/A/2015/006728) (7 pages).
Email and Response to Mexican institute of Industrial Property (MIIP) Office Action per Letter dated Mar. 4, 2019 to Foreign Counsel (Becerril, Coca & Becerril) (for related Mexican Application No. MX/A/2015/006728) (13 pages).
Filing Report and Response filed to Mexican Institute of Industrial Property (MIIP) Office Action per Letter dated Mar. 12, 2019 from Foreign Counsel (Becerril, Coca & Becerril) (for related Mexican Application No. MX/A/2015/006728) (7 pages).
Mexican Institute of Industrial Property (MIIP) Office Action per Letter dated Jun. 25, 2019 from Foreign Counsel (Becerril, Coca & Becerril) (for related Mexican Application No. MX/A/2015/006728) (10 pags).

* cited by examiner

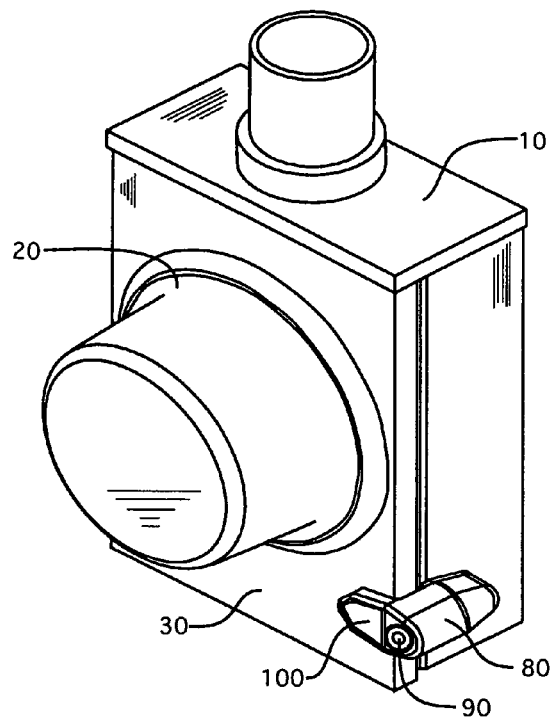
FIG. 3
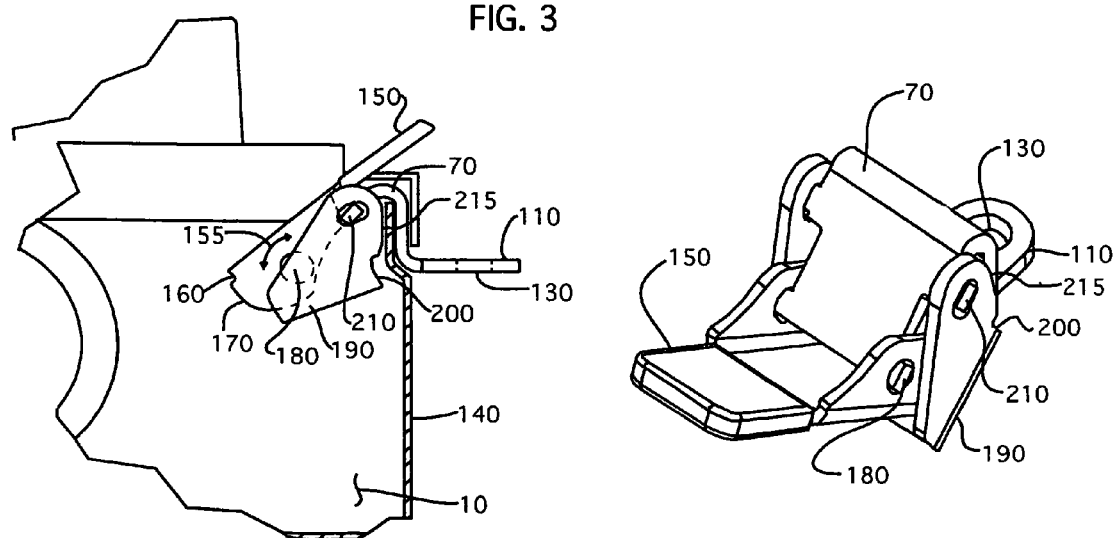
FIG. 4A
FIG. 4B

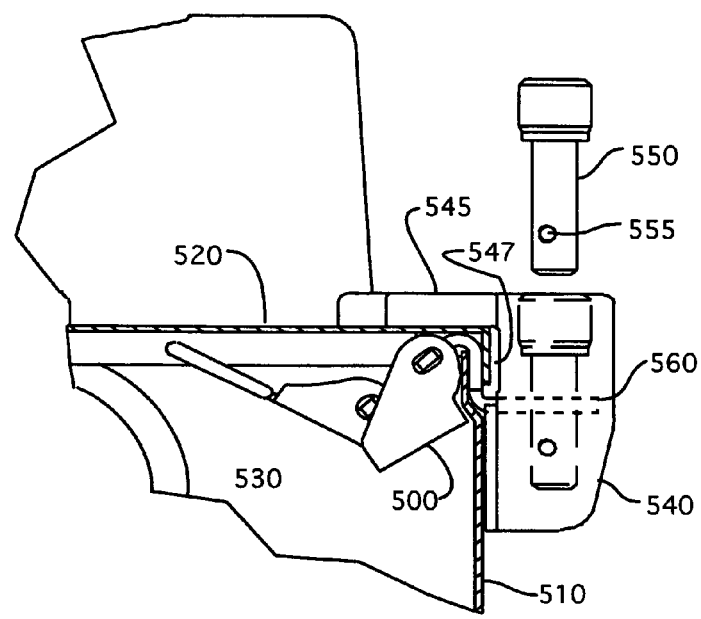
FIG. 7A
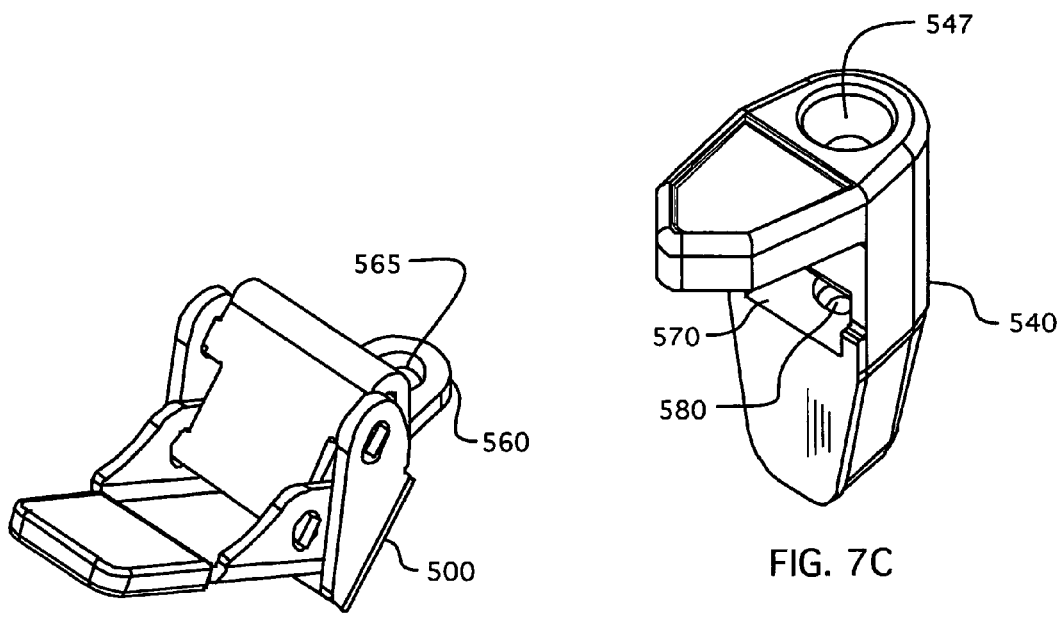
FIG. 7B
FIG. 7C

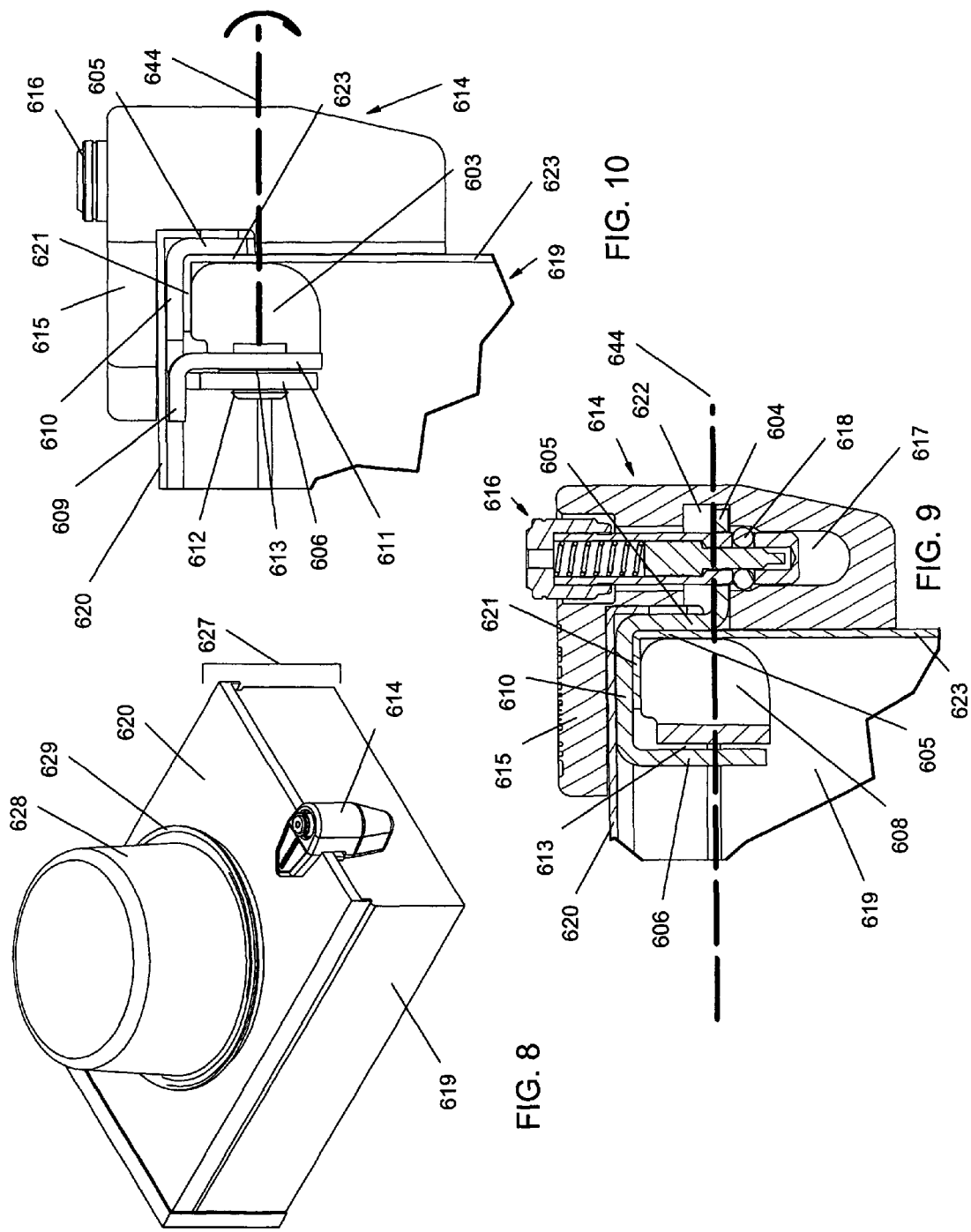

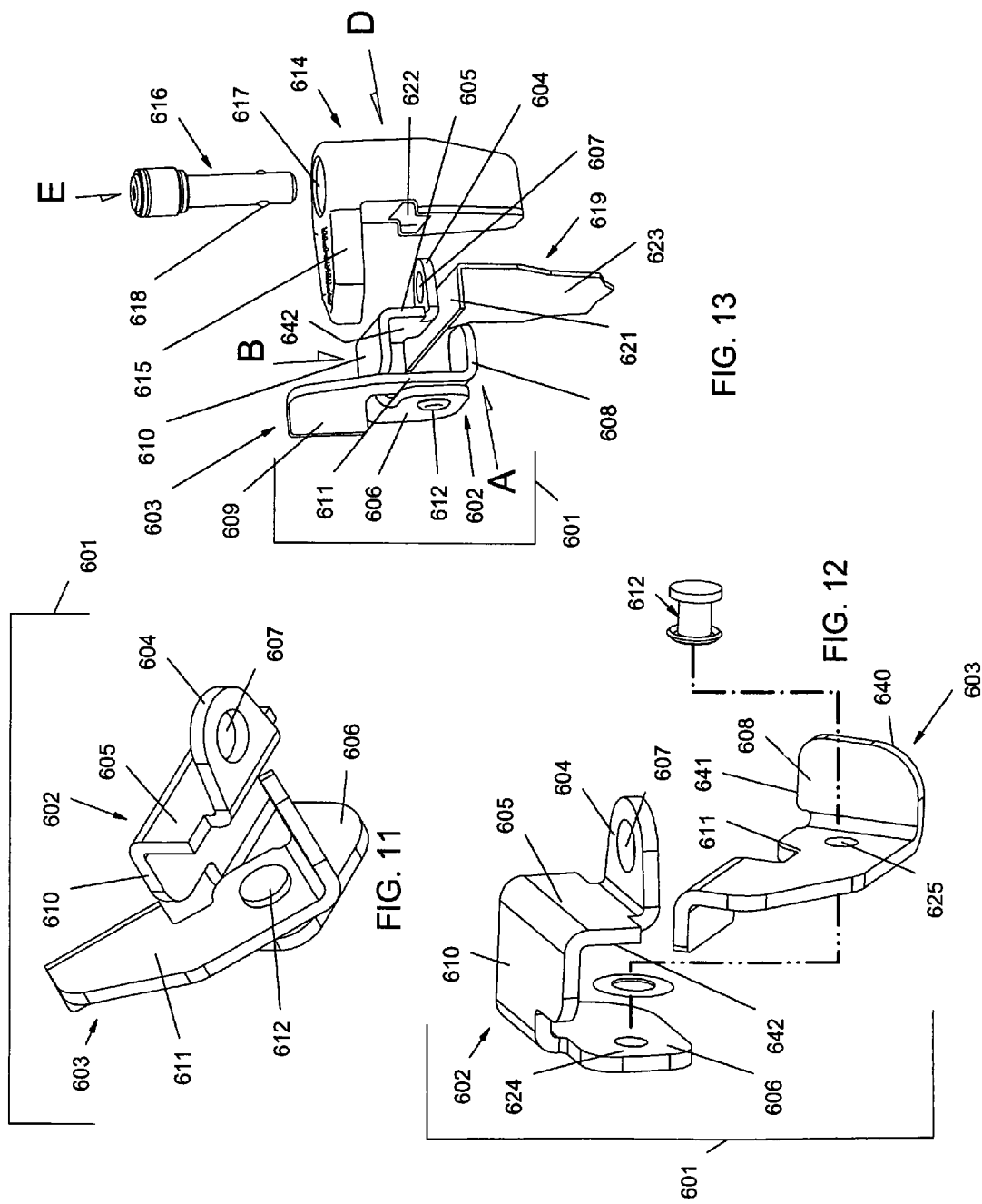

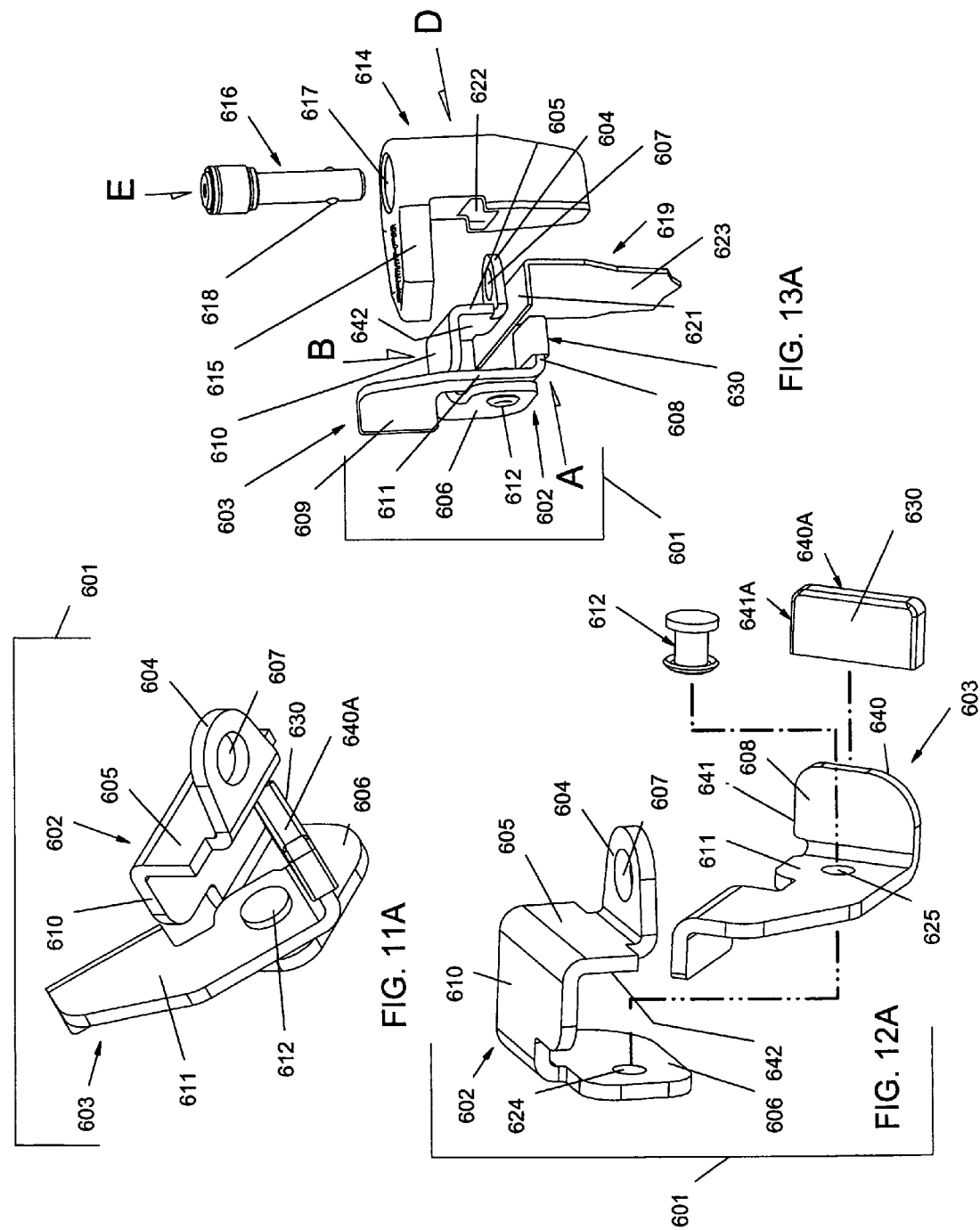

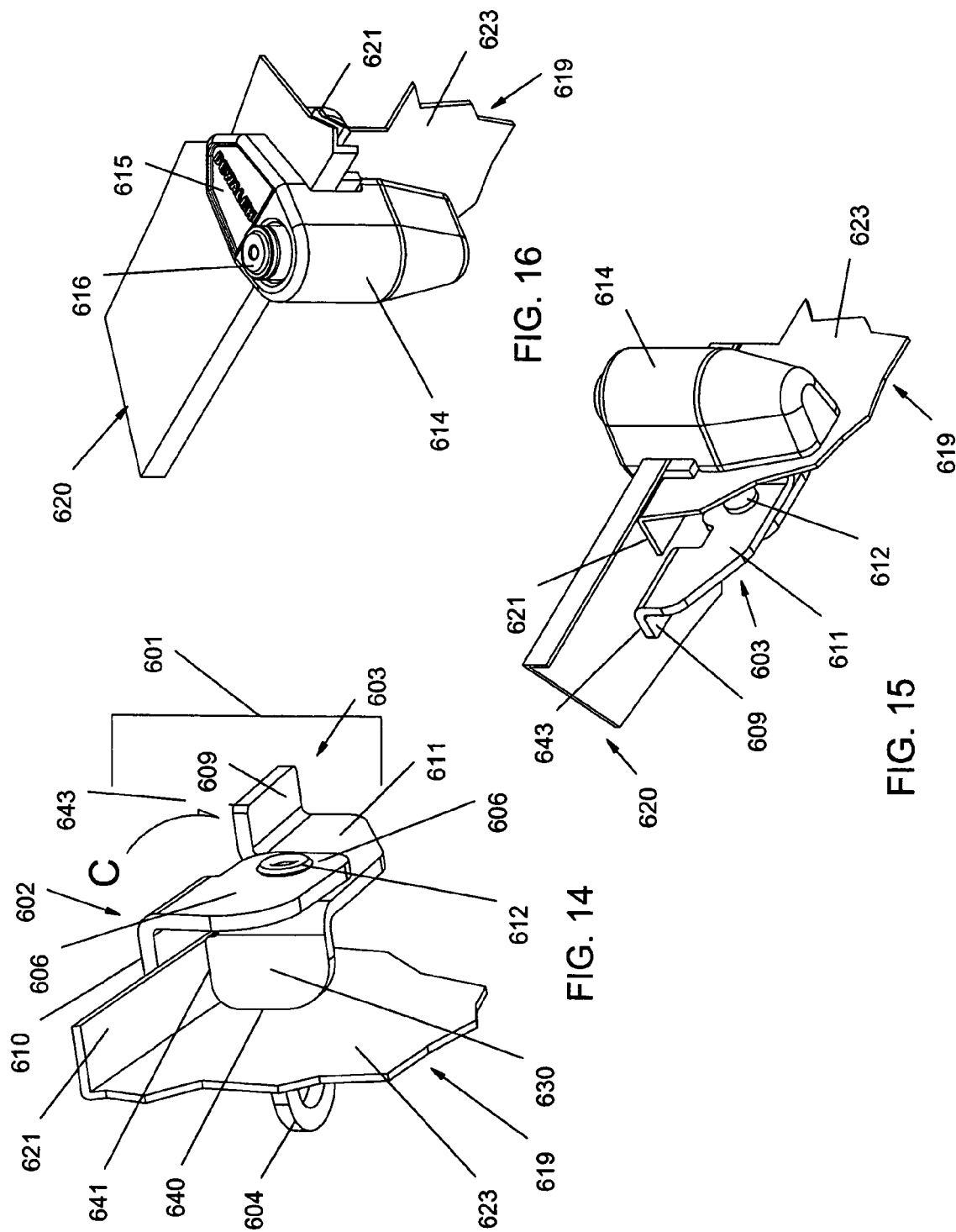

APPARATUS AND METHOD FOR SECURING AN ENCLOSURE

CROSS-REFERENCE TO RELATED APPLICATIONS

This application is a continuation of application Ser. No. 11/705,653, filed Feb. 12, 2007, now abandoned which is a continuation-in-part of application Ser. No. 10/823,285, filed Apr. 13, 2004, now U.S. Pat. No. 7,176,376, and also a continuation-in-part of Ser. No. 11/434,665, filed May 16, 2006, now abandoned which claims the benefit of U.S. Provisional Application No. 60/681,200, filed May 16, 2005, and U.S. Provisional Application No. 60/793,104, filed Apr. 19, 2006, and also a continuation-in-part of International Application No. PCT/US2006/018783, filed May 16, 2006.

The instant application claims priority to each of the above-referenced applications. All written material, figures, and other disclosure in each of the above-referenced applications are hereby incorporated by reference.

BACKGROUND OF THE INVENTION

Electrical service providers generally deliver electricity to their customers via power lines buried underground or distributed along poles or towers overhead. The provider's power lines are usually distributed from a power generation station to numerous sets of customer lines, so that customers can then use the power to satisfy their various electrical needs. To measure delivered power so that customers can be billed in proportion to their usage, service providers typically terminate their power lines at a customer's home or business facility through a metered socket box, various designs for which are well known.

A meter box is generally used by electric utility companies, however the invention herein may be used with other utility service enclosures in the gas, water, cable, TV utility industries or with enclosures generally in various other industries as well.

An example of one previously known meter box consists of two sets of electrical posts, with a provider's transmission lines being connected to one set of posts, and the customer's service lines to the other set. In order to measure the amount of electricity a customer uses, the meter box is configured to accept a watthour meter or another electricity usage measurement device which, when plugged into the socket box, permits transmission of electricity from the provider to the customer and allows the amount of transmitted electricity to be accurately measured, so that the provider can charge the customer for power usage at an appropriate rate.

Various designs and uses for watthour meters are also well known, and all such designs and uses are incorporated into the teachings of the present invention. The present invention is also applicable in situations where the customer's service lines are routed from the meter box to a breaker box so that electricity can be distributed to multiple service locations using additional sets of electrical lines or wires.

Presently, there are two common types of meter socket boxes, each distinguished by the manner in which the meter is secured in place once it has been plugged into an electrical socket disposed in the meter box. For example, a ringed type meter box fitted with a flanged front cover is known, within which a watthour meter is disposed so that a head portion of the meter passes out through a flanged opening in the front cover. In this configuration, the meter is generally held in place using an annular, lockable sealing ring.

Also known is a ringless type meter box, in which the box cover secures the meter in place. For example, a ringless type meter box may include a box cover and a box base. Referring now to prior art FIG. 1, a ringless type meter box 10 includes an installed meter 20 and a box cover 30, the meter box cover being shown prior to installation. Formed around an opening in a central portion of meter box cover 30 is a flange 40; a complementary flange 50 is disposed on meter 20 such that, when meter box cover 30 is installed over and around the head of meter 20, for example, then the meter 20 complementary flange 50 is encased by meter box cover flange 30, and complementary flange sections 40 and 50 join together, so that the meter cannot be easily removed from the electrical socket unless the cover is first removed from the meter box or meter box base.

The meter box cover 30 is typically secured in place by means of a small latch assembly, which functions in structural cooperation with a complementary latch-receiving member disposed on the meter box or base 10. The meter box cover 30 is used to secure the meter 20 to the electrical socket (not shown), so that completion of an electrical circuit is ensured, and the meter is reliably prevented from falling out of the meter box socket.

The meter box cover 30 also prevents unauthorized persons from tampering with the meter. For example, some customers have attempted to bypass the meter, so that unmeasured electricity could be used free of charge. Also, service providers are sometimes forced to disconnect service to customers, for example, due to non-payment of monthly bills. In this event, a locked meter box cover helps prevent a customer from entering the meter box and reconnecting electrical service. However, in instances where the small latch assembly on the meter box fails to provide sufficient security for preventing unauthorized access to the meter and meter box socket, a sturdier, more tamper resistant solution is required.

There are presently only a few commonly used security devices for securing meter box covers to socket boxes. One type requires an installer to drill or punch a hole in the meter box prior to installation of a fastening device. However, some installers are independent contractors rather than employees of the companies that own the meter boxes, and thus drilling or punching a starter hole in the box is sometimes undesirable. Also, drilling takes additional time and adds more steps to the installation, each of which could be avoided if drilling were not required.

To overcome these shortcomings, there are also locks that can be installed on ringless meter socket boxes that do not require drilling or punching a hole in the meter box. Several examples of patents which disclose attempts to solve some of the above problems are set forth as follows.

The Inner-Tite Jiffy Lock™ or "IT Lock," shown in U.S. Pat. No. D-463,248, and U.S. Pat. No. 6,763,691 to Rafferty, entitled "Meter Box Lock Assembly," is directed to lock assembly for use in combination with an electric meter box or other like enclosure having a bottom, a side wall, and a cover which may be opened to gain access to the interior of the box, and which when closed, overlaps an upper edge of the side wall. The lock assembly includes a bracket having first and second mutually spaced flanges integrally joined by an intermediate web. A jaw is mechanically interengaged with and carried by the bracket for movement between its flanges. The bracket is configured for removable mounting on the side wall, with its intermediate web interposed between the cover and the upper edge of the side wall, and with the first flange and the jaw respectively located adjacent exterior and interior surfaces of the side wall. The jaw is urged towards the first flange to clamp the side wall therebetween, and a cap is secured to the bracket. The cap has a lip configured and dimensioned to overlap and maintain the cover in a closed position.

The McGard Intimidator Sidewinder-Lock™ shown in U.S. Pat. No. 6,742,365 to Sullivan et al, entitled "Ringless Meter Lock," discloses a locking mechanism for securing the cover of a thin-walled box to the box frame. The locking mechanism includes a clip bracket adapted to engage a wall of the box frame, a lock body adapted to latch to the clip bracket and engage the box cover, a locking member carried by the clip bracket and adapted to clamp the clip bracket to the box wall when the locking member is in a clamping position, and a pivotable actuating lever adapted to actuate the locking member into the clamping position. The locking member and the actuating lever can be implemented as a two-piece system comprising first and second pivoting members. Alternatively, the locking member and the actuating lever can be integrally formed as a one-piece system. The locking mechanism is capable of multiple mounting positions on the box without drilling, and uses a spring-loaded plunger assembly that allows for quick, keyless, slam installation.

There is, therefore, a need for a locking apparatus, system, and method for securing at least one structure or a plurality of structures, to secure a utility service enclosure or enclosure generally, and there remains a need for a meter box security device that can be easily and quickly installed, which reliably ensures that the box cover cannot be shut once the support assembly is hung on a wall unless the clamping member is properly secured to a meter box wall. There is also a need for a meter box security apparatus that offers greater security for preventing unauthorized entry into a meter box than is known in the prior art. There is also a need for a meter box security device having a reduced number of parts, so as to limit system complexity and minimize manufacturing costs.

Those of skill in the art will appreciate the present invention which addresses the above needs and other significant needs the solution to which are discussed hereinafter.

SUMMARY OF THE INVENTION

In an example embodiment additional security is provided to a watthour meter box.

Another example embodiment secures the watthour meter box lid to the meter box base.

Another example embodiment provides a watthour meter box security apparatus that helps prevent unauthorized watthour meter box lid removal from the watthour meter box base.

Another example embodiment provides a watthour meter box security apparatus that can be installed without any tools.

Another example embodiment provides a watthour meter box security apparatus that can be attached to the wall of watthour meter box base.

Another example embodiment provides a watthour meter box security apparatus that will not interfere with dangerous components inside the meter box.

Another example embodiment provides a watthour meter security apparatus that will not interfere with the normal operation of the lid.

These and other embodiment, features, and advantages will become apparent from the drawings, the descriptions given herein, and the appended claims. Further example embodiments are also indicated below in various example embodiments of the invention. However, it will be understood that the above-listed embodiments and/or advantages of the invention are intended only as an aid in quickly understanding aspects of the invention, are not intended to limit the invention in any way, and therefore do not form a comprehensive or restrictive list of embodiments and/or features, and/or advantages.

One example purpose of the present invention, which will be described subsequently in greater detail, is to secure the lid of a watthour meter box to the base of a watthour meter box.

Accordingly, one embodiment of the present invention provides an apparatus for securing a box cover to a watthour meter socket box so as to address the needs as described above.

According to one embodiment of the invention, an apparatus for securing a box cover to a watthour meter socket box is provided, the apparatus comprising a clamping member having a clamp, a clamp actuating member, and a fastening shelf having a first securing means; and a lock housing having a second securing means.

According to a further embodiment of the invention, there is also provided a method for securing a box cover to a watthour meter socket box including disposing a clamping member having a clamp, a clamp actuating member, and a fastening shelf in proximity with a lock housing, and then locking the lock housing onto the clamping member using a fastening member.

Another example embodiment of the present invention includes at least a locking bracket and a lock housing. The locking bracket includes at least a clamping member, fastening lever, and compression member. In an alternative embodiment, the locking bracket further includes at least a flexural member.

The lock housing generally includes at least a lock body or member incorporating a flange. The flange preferably has a generally perpendicular orientation with respect the lock housing. In one example embodiment, the lock housing has a unitary configuration. The locking bracket is adapted to be attached to a portion of a wall of the watthour meter box and to receive the lock housing after the lid of the watthour meter box is in place.

An example embodiment includes at least a shaft-style locking device cooperatively configured for securing the lock housing to the locking bracket so as to prevent removal of the meter box lid from the meter box base. In an alternative embodiment, the lock housing may be configured for use with any locking device suitable for securing the lock housing to the locking bracket so as to prevent removal of the meter box lid.

In another embodiment, a locking device for securing the lid of a watthour meter box to a watthour meter box base includes at least: a latch assembly and a lock housing member, the latch assembly adapted to affix to a wall of a watthour meter box base, the latch assembly including a bracket member and a lever member, a first bracket portion disposed on the bracket member adapted to pivotably carry the lever member allowing rotational motion of the lever member about an axis located generally perpendicular to the planar face of the first bracket portion, a portion of the lever member adapted to bear against a wall of the meter box base thus trapping the wall between a second bracket portion disposed on the bracket member, a third bracket portion disposed on the bracket member adapted to be received by and affixed to the lock housing member, a flange disposed on the lock housing member adapted to secure a meter box lid to a meter box base.

In one example embodiment, a method for securing a lid to a watthour meter box having an interior is provided. The method includes at least: attaching a locking bracket to a wall of the watthour meter box; installing the lid over at least a portion of the bracket; and securing a locking housing to the bracket to prevent removal of the lid. In one example embodiment, the step of attaching the locking bracket to the wall of the watthour meter box is performed from a position substantially outside the interior of the watthour meter box. In this way, the bracket is substantially manipulable without needing to place any portion of one's hand or an object in the interior of the watthour meter box.

In another example embodiment, attaching means may be used for mounting the bracket to the wall of the watthour meter box without having to reach into the interior of the box. A latch member may be lever-type structure and a member engageable with a meter box wall. Various locking means may be used to secure the lid to the watthour meter box.

In another example embodiment the locking bracket includes at least a body and only one moveable member. In another embodiment, the moveable member is pivotable with respect to the body. In another embodiment, the moveable member preferably further includes at least a compression member.

In an example embodiment, the moveable member includes at least an actuating lever which is moveable (or for example, pivotable) in a plane that is substantially parallel to the plane of the wall to which the locking bracket is being attached. The actuating lever ideally is configured with a compression member at a distal end of the actuating lever such that the compression makes arcuate (or sweeping rotational) engagement with the wall when force is applied to the actuating lever. The actuating lever is ideally configured with at least one elongated member which serves as a moment arm to facilitate engagement.

In another example embodiment, the locking bracket includes at least a reversible design configuration. That is, the locking bracket may be manufactured in a first design configuration such that the actuating lever may be rotated in a functional clockwise direction to attach the bracket or in a second design configuration such that the actuating lever may be rotated in a functional counter-clockwise direction to attach the bracket. The first or second design configuration may be employed as desired for use in situations where there are limited locations for attaching the locking bracket or to foster ease of use by a right- or left-handed person.

Another example embodiment of the present invention includes at least a locking bracket for use with a lock housing. The locking bracket includes at least a clamping member, fastening lever, and compression member. The locking bracket is configured for mounting a lock housing to capture at least a portion of the lid of a watthour meter box. A locking shaft is adapted to be installed in the lock housing so as to secure the lid in place on the watthour meter box.

In another example embodiment of the apparatus the lever end is in functional cooperation with a portion of a lock housing mounted to a portion of the clamping member such that the lock prevents rotation of the lever to an open position.

In another example embodiment of the apparatus the lever end is in functional cooperation with a portion of a meter box lid such that the lid prevents rotation of the lever to an open position.

In another example embodiment of the apparatus the lever end is at least partially outside the interior of the meter box in a mounting position and at least partially inside the interior of the meter box in a locked position.

In another example embodiment of the apparatus further includes the meter box.

In another example embodiment of the apparatus further includes a locking structure adapted for functional cooperation with the clamping member for securing a meter box lid to a meter box base.

Another example embodiment of an apparatus is provided for securing a box cover to a meter box, the apparatus including at least: a clamping member, wherein the clamping member further includes a clamp, a clamp actuating member, and a fastening shelf having a first securing means; and a lock housing having a second securing means.

In another example embodiment of the apparatus, the clamp further includes opposed, substantially parallel walls on which a pivoting member is disposed.

In another example embodiment of the apparatus, the clamp further includes opposed, substantially parallel walls on which a pivoting member is disposed and the clamp actuating member is captured between the opposed, substantially parallel walls of the clamp when the clamp actuating member is disposed in a fully secured position.

In another example embodiment of the apparatus, the first securing means further includes a portion of the fastening shelf through which an aperture has been formed.

In another example embodiment of the apparatus, the second securing means includes a portion of the lock housing through which an aperture has been formed.

In another example embodiment of the apparatus, the first securing means further includes a portion of the fastening shelf through which an aperture has been formed and the aperture is an approximately cylindrical aperture.

In another example embodiment of the apparatus, the second securing means includes a portion of the lock housing through which an aperture has been formed and the aperture is an approximately cylindrical aperture.

In another example embodiment of the apparatus, the apparatus further includes a plunger type fastener.

In another example embodiment of the apparatus, the apparatus further includes a plunger type fastener, wherein the plunger type fastener further includes a retaining member.

In another example embodiment of the apparatus, the clamp actuating member rotates about a rotational axis established by disposition of an engagement member on a body portion of the clamping member.

In another example embodiment of the apparatus, the clamp actuating member rotates about a rotational axis established by disposition of an engagement member on a body portion of the clamping member and one end of the clamp actuating member receives an input force and rotates about an axis established by disposition of the engagement member disposed on the clamping member, and then translates a mechanical force to an opposite end of the clamp actuating member that is greater than the input force.

In another example embodiment of the apparatus, the clamp actuating member has a tactile feedback indicator for indicating when the clamp actuating member has been fully rotated into a secure position.

In another example embodiment of the apparatus, the clamp is disposed between the clamp actuating member and the fastening shelf.

In another example embodiment of the apparatus, the clamp further includes a stopping member for stopping a rotational sweep of the clamp actuating member after the clamp actuating member is disposed in a fully secured position.

In another example embodiment of the apparatus, the clamp imparts a spring force that holds the clamp actuating member in a fully secured position.

Another example embodiment of a method is provided for securing a box cover to a meter box, the method including at least: disposing a clamping member over a wall portion of the meter box, wherein the clamping member includes a clamp, a clamp actuating member, and a fastening shelf having a first securing means; disposing a lock housing in functional cooperation with the clamping member, wherein the lock housing includes a second securing means; and securing the clamping member using the lock housing.

In another example embodiment of the method, the method further includes disposing a fastening shelf so that the first securing means includes a body portion of the fastening shelf through which an aperture has been formed.

In another example embodiment of the method, the method further includes disposing a fastening shelf so that the first securing means includes a body portion of the fastening shelf through which an aperture has been formed and the method further includes disposing a lock housing so that the second securing means includes a lock housing through which an aperture has been formed.

In another example embodiment of the method, the method further includes disposing a fastening shelf so that the first securing means includes a body portion of the fastening shelf through which an aperture has been formed, and the method further includes disposing a lock housing so that the second securing means includes a lock housing through which an aperture has been formed, and the method further includes disposing a fastening shelf and a lock housing so that the first securing means and the second securing means comprise approximately cylindrical apertures.

In another example embodiment of the method, the method further includes disposing a plunger type fastener.

In another example embodiment of the method, the method further includes disposing a plunger type fastener, and further includes disposing a plunger type fastener, and then securing the plunger type fastener by means of a retaining member.

In another example embodiment of the method, the method further includes rotating the clamp actuating member about a rotational axis established by disposition of an engagement member disposed on a body portion of the clamping member.

In another example embodiment of the method, the method further includes rotating the clamp actuating member about a rotational axis established by disposition of an engagement member disposed on a body portion of the clamping member, and further includes: delivering an input force to one end of the clamp actuating member so that the clamp actuating member rotates about a rotational axis established by disposition of an engagement member on the clamping member; and translating the input force into a mechanical clamping force that is greater than the input force.

In another example embodiment of the method, the method further includes disposing a clamp actuating member having a tactile feedback indicator to indicate when the clamp actuating member has been fully rotated into a secure position.

In another example embodiment of the method, the method further includes disposing the clamp between the clamp actuating member and the fastening shelf.

In another example embodiment of the method, the method further includes disposing the clamp between the clamp actuating member and the fastening shelf, and furthering includes disposing a clamp having a stopping member, wherein the stopping member stops a rotational sweep of the clamp actuating member after the clamp actuating member is disposed in a fully secured position.

In another example embodiment of the method, the method further includes disposing the clamp between the clamp actuating member and the fastening shelf, and furthering includes disposing a clamp imparting a spring force that holds the clamp actuating member in a fully secured position.

Another example embodiment of a method is provided for securing a ringless socket box lid to a socket box, the method including at least: disposing a base support structure in proximity with a wall portion of the socket box, wherein the base support structure includes a bracket and a fastening lever; securing the base support structure to the wall portion of the socket box by hanging the base support structure over the wall portion and then rotating the fastening lever toward a fully secured position; installing a socket box lid, wherein the socket box lid is only fully installable if the fastening lever has been rotated completely into a fully secured position; and affixing a lock housing to the base support structure, wherein the lock housing holds the socket box lid securely in place.

Another example embodiment of an apparatus is provided for securing a box cover to a meter box, the meter box being defined by a plurality of side walls, the apparatus including at least: a clamping member attachable to one of the plurality of side walls; a fastening lever; and a pivotal connection between the clamping member and the fastening lever, the pivotal connection including an axis of rotation extending through the pivotal connection, the axis of rotation extending into at least one of the box cover or the one of the plurality of side walls when the box cover is secured to the meter box.

In another example embodiment of the apparatus, the apparatus further includes a portion of the fastening lever member adapted to bear against the one of the plurality of side walls of the meter box.

In another example embodiment of the apparatus, the apparatus further includes a portion of the fastening lever member adapted to bear against the one of the plurality of side walls of the meter box, wherein the portion of the fastening lever member adapted to bear against the one of the plurality of side walls of the meter box includes a planar surface.

In another example embodiment of the apparatus, the apparatus further includes a portion of the fastening lever member adapted to bear against the one of the plurality of side walls of the meter box, wherein the portion of the fastening lever member adapted to bear against the one of the plurality of side walls of the meter box includes a planar surface, and the planar surface is rotatable with respect to the one of the plurality of side walls.

In another example embodiment of the apparatus, the apparatus further includes a portion of the fastening lever member adapted to bear against the one of the plurality of side walls of the meter box, wherein the portion of the fastening lever member adapted to bear against the one of the plurality of side walls of the meter box is arcuate.

In another example embodiment of the apparatus, the apparatus further includes a portion of the fastening lever member adapted to bear against the one of the plurality of side walls of the meter box, and further including a resilient compression member secured to the portion of the fastening lever member adapted to bear against the one of the plurality of side walls.

In another example embodiment of the apparatus, the apparatus further includes a biasing member secured to at least one of the clamping member or the fastening lever.

In another example embodiment of the apparatus, the clamping member includes a first planar surface and the fastening lever includes a second planar surface, the pivotal connection pivotally interconnecting the first planar surface to the second planar surface.

In another example embodiment of the apparatus, the apparatus further includes a lever end, the lever end surface being pivotally moveable between a mounting and a locked position without entering into an interior of the meter box.

In another example embodiment of the apparatus, the apparatus further includes a lever end, the lever end surface being pivotally moveable between a mounting and a locked position without entering into an interior of the meter box, wherein the lever end is in functional cooperation with a portion of a lock housing mounted to a portion of the clamping member such that the lock prevents rotation of the lever to an open position.

In another example embodiment of the apparatus, the apparatus further includes a lever end, the lever end surface being pivotally moveable between a mounting and a locked position without entering into an interior of the meter box, wherein the lever end is in functional cooperation with a portion of a meter box lid such that the lid prevents rotation of the lever to an open position.

In another example embodiment of the apparatus, the apparatus further includes a lever end, the lever end surface being pivotally moveable between a mounting and a locked position without entering into an interior of the meter box, wherein the lever end is at least partially outside the interior of the meter box in a mounting position and at least partially inside the interior of the meter box in a locked position.

In another example embodiment of the apparatus, the apparatus further includes the meter box.

In another example embodiment of the apparatus, the apparatus further includes a locking structure adapted for functional cooperation with the clamping member for securing a meter box lid to a meter box base.

Another example embodiment of an apparatus is provided for securing a box cover to a meter box, the meter box being defined by a plurality of side walls, the apparatus including at least: a clamping member attachable to one of the plurality of side walls; a fastening lever with a planar engagement surface adapted to bear against the one of the plurality of side walls of the meter box; and a pivotal connection between the clamping member and the fastening lever whereby the planar engagement surface rotates with respect to the one of the plurality of side walls.

In another example embodiment of the apparatus, the apparatus further includes a compression member secured to the planar engagement surface.

In another example embodiment of the apparatus, the apparatus further includes a biasing member secured to at least one of the clamping member or the fastening lever.

In another example embodiment of the apparatus, the apparatus further includes an axis of rotation extending through the pivotal connection, the axis of rotation extending into the one of the plurality of side walls.

In another example embodiment of the apparatus, the apparatus further includes an axis of rotation extending through the pivotal connection, the axis of rotation extending into the one of the plurality of side walls, wherein the axis of rotation is at least approximately orthogonal to the one of the plurality of side walls.

Another example embodiment of an apparatus is provided for securing a box cover to a meter box, the meter box being defined by a plurality of side walls, the apparatus including at least: a clamping member attachable to one of the plurality of side walls, the clamping member including a first planar surface; a fastening lever including a lever end, a second planar surface secured to the lever end, and a wall engagement surface secured to the second planar surface; and a pivotal connection between the first planar surface and the second planar surface, the clamping member and the fastening lever being pivotally connected together for relative movement between a mounting position and a locked position in response to force applied to the lever end, and being configured such that in the locked position, the wall engagement surface engages the one of the plurality of side walls.

In another example embodiment of the apparatus, the pivotal connection includes an axis of rotation extending through the pivotal connection, the axis of rotation extending into at least one of the box cover or the one of the plurality of side walls when the box cover is secured to the meter box.

Another example embodiment of a locking device is provided for securing a box cover to a meter box, the meter box including a side wall, the locking device including at least: a lock housing member; a flange disposed on the lock housing member adapted to secure the box cover to the meter box; and a latch assembly adapted to affix to the side wall of the meter box, the latch assembly including a bracket member and a lever member, a first bracket portion disposed on the bracket member adapted to pivotably carry the lever member allowing rotational motion of the lever member about an axis located generally perpendicular to a planar face of the first bracket portion, a second bracket portion disposed on the bracket member, a third bracket portion disposed on the bracket member adapted to be received by and affixed to the lock housing member, a portion of the lever member adapted to bear against the side wall of the meter box thus trapping the side wall between the second bracket portion and the portion of the lever member adapted to bear against the side wall of the meter box.

Another example embodiment of a locking device is provided for securing a box cover to a meter box, the meter box including a side wall, including at least: a bracket mountable to the side wall; and a latching member for securing the bracket to the wall of the meter box without having to reach into the interior of the box.

In another example embodiment of the locking device, the latching member is substantially manipulable without needing to place any portion of one's hand or an object into the interior of the meter box.

Another example embodiment of a method is provided for securing a lid to a watthour meter box having an interior defined by at least one wall, the at least one wall including a flange extending inwardly to the at least one wall such that a lower side of the flange faces away from the lid when the lid is secured to the watthour meter box, the method including at least: attaching a locking bracket to the at least one wall such that at least a portion of the locking assembly engages the lower side of the flange; installing the lid over at least a portion of the locking bracket; and securing a locking housing to the locking bracket to prevent removal of the lid.

In another example embodiment of the method, the step of attaching further includes moving a lever such that the moving is performed from a position substantially outside the interior of the watthour meter box.

Another example embodiment of an apparatus is provided for securing a box cover to a meter box, the meter box being defined by at least one side wall, the apparatus including at least: a clamping member attachable to the at least one side wall; a fastening lever; and a resilient compression member carried by the fastening lever, the resilient compression member being adapted to bear against the at least one side wall.

Another example embodiment of a method is provided for manufacturing an apparatus for securing a box cover to a meter box, the meter box being defined by a plurality of side walls, the method including at least: providing a clamping member attachable to one of the plurality of side walls; and selectively securing a fastening lever to the clamping member in at least one of two different design configurations, the first design configuration requiring that the fastening lever is mounted for rotation in a first rotational direction to fasten the clamping member to the one of the plurality of side walls, and the second design configuration requiring that the fastening lever is mounted for rotation in a second rotational direction to fasten the clamping member to the one of the plurality of side walls.

In another example embodiment of the method, the first rotational direction is opposite to the second rotational direction.

Another example embodiment of an apparatus is provided for securing a cover to an enclosure, the apparatus including at least: a locking bracket, wherein the locking bracket further includes an engagement member and a mounting member, the engagement member including a biased engagement flange and being biased to engage a structural portion of the enclosure, the locking bracket further including a fastening shelf being connected to the mounting member, the fastening shelf including a first securing means; and a lock housing including a second securing means.

Another example embodiment provides a method for creating a seal, the method including at least: uniting a connector housing member including at least a force-bearing surface to a receiver housing member including at least an engaging member; disposing a frangible member on the receiver housing member for urging contact of the connector housing member with the engaging member, wherein the frangible member bears against the force-bearing surface of the connector housing member urging contact of the connector housing member with the engaging member during the uniting; and flexibly biasing the engaging member to engage the connector housing member to create a seal, wherein the engaging member is disposed separably with respect to the frangible member.

In another example embodiment of the method, the frangible member further includes at least a frangible sealing device.

Another example embodiment provides a method for securing a box cover to a meter box, the method including at least: disposing a clamping member over a wall of said meter box, the wall including at least an upper portion and a lower portion, the wall having an angled portion disposed between the upper portion and lower portion of the wall, wherein said clamping member includes at least a clamp, a clamp actuating member, and a fastening shelf having a first securing means, and wherein said clamping member is adapted to engage at least just the upper portion of the wall above the angled portion;

disposing a lock housing in functional cooperation with said clamping member, wherein said lock housing includes at least a second securing means; and securing said clamping member using said lock housing.

Another example embodiment of the method further includes at least disposing a fastening shelf so that said first securing means comprises a body portion of said fastening shelf through which an aperture has been formed.

Another example embodiment of the method further includes at least disposing a lock housing so that said second securing means comprises said lock housing through which an aperture has been formed.

Another example embodiment of the method further includes at least disposing a fastening shelf and said lock housing so that said first securing means and said second securing means comprise approximately cylindrical apertures.

Another example embodiment of the method further includes at least disposing a plunger type fastener.

Another example embodiment of the method further includes at least disposing a plunger type fastener, and then securing said plunger type fastener by means of a retaining member.

Another example embodiment of the method further includes at least rotating said clamp actuating member about a rotational axis established by disposition of an engagement member disposed on said body portion of said clamping member.

Another example embodiment of the method further includes at least delivering an input force to one end of said clamp actuating member so that said clamp actuating member rotates about a rotational axis established by disposition of said engagement member on said clamping member; and translating said input force into a mechanical clamping force that is greater than the input force.

Another example embodiment of the method further includes at least disposing a clamp actuating member having a tactile feedback indicator to indicate when said clamp actuating member has been fully rotated into a secure position.

Another example embodiment of the method further includes at least disposing said clamp between said clamp actuating member and said fastening shelf.

Another example embodiment of the method further includes at least disposing a clamp having a stopping member, wherein said stopping member stops a rotational sweep of said clamp actuating member after said clamp actuating member is disposed in a fully secured position.

Another example embodiment of the method further includes at least disposing a clamp imparting a spring force that holds said clamp actuating member in a fully secured position.

Another example embodiment provides an apparatus for connecting first and second ends of a watthour meter box ring adapted for use in securing a watthour meter to a watthour meter box, the apparatus including at least: a connector housing member including at least a force-bearing surface, the connector housing member being mountable on the first end of the watthour meter box ring; a receiver housing member being mountable on the second end of the watthour meter box ring; an engaging member disposable between the receiver housing member and connector housing member, wherein the engaging member is flexibly biased to engage the connector housing member; and a frangible member disposed on the receiver housing member, wherein the frangible member is adapted to bear against the force-bearing surface of the connector housing member so as to urge contact of the connector housing member with the engaging member when the connector housing member is connected with the receiver housing member.

In another example embodiment of the apparatus, the frangible member further comprises a frangible sealing device.

Another example embodiment provides an apparatus for securing a box cover to a meter box, said apparatus including at least: a clamping member adapted to be disposed over a wall of said meter box, the wall including at least an upper portion and a lower portion, the wall having an angled portion disposed between the upper portion and lower portion of the wall, wherein said clamping member includes at least a clamp, a clamp actuating member, and a fastening shelf having a first securing means, and wherein said clamping member is adapted to engage at least just the upper portion of the wall above the angled portion; a lock housing in functional cooperation with said clamping member, wherein said lock housing includes at least a second securing means; and a securing member to secure said clamping member using said lock housing.

In another example embodiment of the apparatus, said fastening shelf is disposed so that said first securing means comprises a body portion of said fastening shelf through which an aperture has been formed.

In another example embodiment of the apparatus, said lock housing is disposed so that said second securing means comprises said lock housing through which an aperture has been formed.

In another example embodiment of the apparatus, said fastening shelf and said lock housing are adapted so that said first securing means and said second securing means comprise approximately cylindrical apertures.

Another example embodiment of the apparatus further comprises a plunger type fastener.

In another example embodiment of the apparatus, said plunger type fastener is secured by means of a retaining member.

Another example embodiment of the apparatus further comprises said clamp actuating member being rotated about a rotational axis established by disposition of an engagement member disposed on said body portion of said clamping member.

The content and disclosure of each of the following applications/publications are specifically hereby incorporated by reference: U.S. patent application Ser. No. 11/705,653, filed Feb. 12, 2007; U.S. patent application Ser. No. 10/823,285, filed Apr. 13, 2004; U.S. patent application Ser. No. 11/434,665, filed May 16, 2006; International Patent Application No. PCT/US2006/018783, filed May 16, 2006 (which claims the benefit of U.S. Provisional Application No. 60/681,200, filed May 16, 2005, U.S. Provisional Application No. 60/793,104, filed Apr. 19, 2006); U.S. Provisional Application No. 60/681,200, filed May 16, 2005; and U.S. Provisional Application No. 60/793,104, filed Apr. 19, 2006.

There has thus been outlined, rather broadly, the more important features of the invention in order that the detailed description thereof may be better understood, and in order that the present contribution to the art may be better appreciated. There are additional features of the invention that will be described hereinafter.

In this respect, before explaining at least one example embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

To the accomplishment of the above and related objects, this invention may be embodied in the form illustrated in the accompanying drawings, attention being called to the fact, however, that the drawings are illustrative only, and that changes may be made in the specific construction illustrated.

BRIEF DESCRIPTION OF THE DRAWINGS

Various other objects, features and attendant advantages of the present invention will become fully appreciated as the same becomes better understood when considered in conjunction with the accompanying drawings, in which like reference characters designate the same or similar parts throughout the several views, and wherein:

FIG. 3 shows a closed meter box with a box cover secured using a meter box security apparatus according to the present invention.

FIG. 4A shows a clamping member disposed over a sectional view of a wall portion of a meter box.

FIG. 4B is an isometric view of a clamping member according to the present invention.

FIG. 7A is a plan view of a clamping member and a lock housing, assembled so as to secure a meter box cover to a meter box.

FIG. 7B is an isometric view of a clamping member.

FIG. 7C is an isometric view of a lock housing.

FIG. 8 is a perspective view of the present invention installed onto the watthour meter box in accord with one possible embodiment of the present invention.

FIG. 9 is a side-section view of the present invention installed on a meter box viewed from inside the box in accord with one possible embodiment of the present invention.

FIG. 10 is a side view of the present invention installed on a meter box viewed from inside the box showing the various components of the locking apparatus.

FIG. 11 is a perspective view of the present invention viewed generally from below, showing the various components of the locking bracket.

FIG. 1A is a side-section view of the present invention as shown in FIG. 11 which may or may not utilize biasing means and wherein, if used, the biasing means may or may not replace, or be used in conjunction with, a flexural member in accord with another possible embodiment of the present invention.

FIG. 12 is a perspective-exploded view of the present invention showing the various components of the locking bracket.

FIG. 12A is a side-section view of the present invention as shown in FIG. 12 which may or may not utilize biasing means such as a compression member and wherein, if used, the biasing means may or may not replace, or be used in conjunction with, a flexural member in accord with another possible embodiment of the present invention.

FIG. 13 is a perspective view of the present invention, illustrating the installation of the entire apparatus onto the meter box base.

FIG. 13A is a side-section view of the present invention as shown in FIG. 13 which may or may not utilize biasing means such as a compression member and wherein, if used, the biasing means may or may not replace, or be used in conjunction with, a flexural member in accord with another possible embodiment of the present invention.

FIG. 14 is a perspective view of the present invention, viewed from below the meter box base front flange, illustrating the installation of the locking bracket onto the meter box base. Portions of the meter box base have been cut away.

FIG. 15 is a perspective view of the present invention, illustrating the locking apparatus position after installation, viewed from below. Portions of the meter box base and lid have been cut away.

FIG. 16 is a perspective view of the present invention illustrating the lock housing position after apparatus installation. Portions of the meter box base and lid have been cut away.

While the present invention will be described in connection with presently preferred embodiments, it will be understood that it is not intended to limit the invention to those embodiments. On the contrary, it is intended to cover all alternatives, modifications, and equivalents included within the spirit of the invention and as defined in the appended claims.

DETAILED DESCRIPTION OF THE INVENTION

Figure 2:
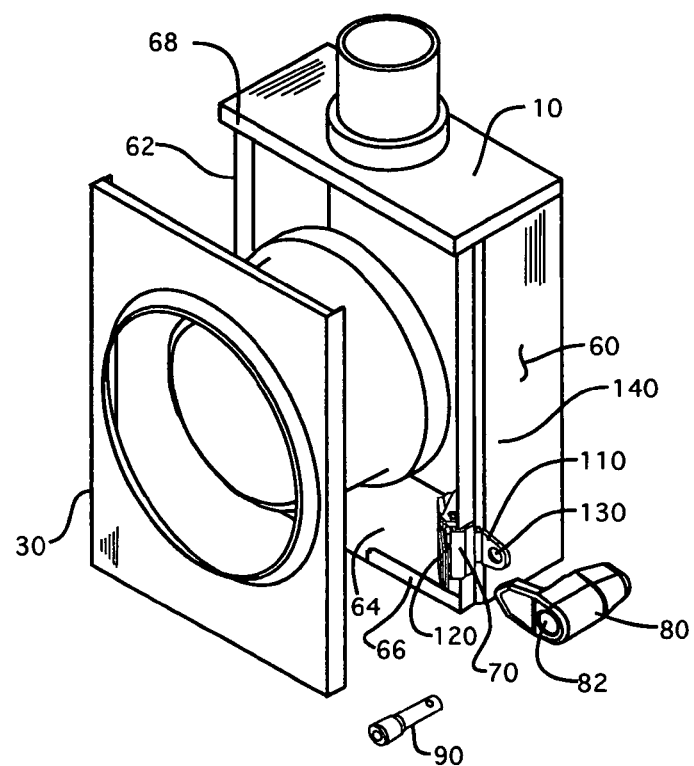
FIG. 2 is an exploded view of a meter box security apparatus comprising a clamping member and a plunger type lock housing.

Referring now to FIG. 2, an exploded view of an example embodiment of the invention is shown, comprising a clamping member 70 disposed over a wall portion 60 of a meter box 10. In FIG. 2, clamping member 70 is shown placed over the sidewall 140 in a non-secured position prior to installation. In other embodiments of the invention, clamping member 70 is disposed over an opposite wall portion 62 of meter box 10. In further example embodiments, clamping member 70 is disposed over a top wall portion 68 of meter box 10. In further example embodiments, clamping member 70 is disposed over a bottom wall portion 64 of meter box 10. In still further example embodiments, clamping member 70 is disposed over a retaining lip 66 disposed on a bottom wall portion 64 of meter box 10.

During installation, clamping member 70 is fastened into place using a clamp actuating member, for example, a fastening lever 120, example embodiments of which are described below. Once clamping member 70 is secured, meter box cover 30 is installed such that clamp actuating member 120 and one end of clamping member 70 are disposed entirely inside an enclosed portion of closed meter box 10, while a fastening shelf 110 remains disposed outside the meter box. In an alternative embodiment, fastening shelf 110 fits inside a slot or other opening in lock housing 80, and the meter box 10 and box cover 30 are fastened together by a plunger type fastener 90 inserted through both an aperture 82 formed in a body portion of lock housing 80 and an aperture 130 formed in a body portion of fastening shelf 110.

As seen in FIG. 3, according to a further example embodiment, a fully installed meter box security apparatus comprises a meter box 10 having a box cover 30 installed over the head of watthour meter 20, and a lock housing 80 fastened to a fastening shelf. Plunger type fastener 90 is inserted into an aperture formed in a body portion of lock housing 80 and then through an aperture formed in a body portion of the fastening shelf, thereby securing the lock housing 80 to the clamping member. Lock housing arm 100 in turn holds a meter box cover 30 securely in place so that the meter cannot be tampered with.

Referring now to FIG. 4A, an example embodiment of the invention is shown, comprising a clamping member 70 hung over a meter box wall portion 140. In a specific, non-limiting embodiment, clamping member 70 is a bracket, further comprising a fastening shelf 110 having an aperture 130 disposed at one end and a clamp actuating member 150 at the other end. A plurality of engagement members 180, 210 is disposed on a body portion of the clamping member 70. The particular location of and uses for the plurality of engagement members 180, 210 will vary according to the requirements of the operational environment.

For example, in certain embodiments, engagement member 210 further comprises a clamp 190 having a plurality of engagement surfaces 200, 215. In this particular embodiment, when clamp actuating member 150 is actuated toward a locked position, upper wall portion 140 is securely clamped between engagement surface 215 and clamping member 70 to achieve a reliable and secure installation. In other embodiments, engagement surface 200 also clamps beneath wall portion 140 to ensure a secure fitting. In a further embodiment, engagement surface 215 does not clamp to upper wall portion 140; in this configuration, only engagement surface 200 is secured beneath a portion of wall 140. An isometric view of some of the aforementioned features is shown in greater detail in FIG. 4B.

Referring again to FIG. 4A, when clamp actuating member 150 is rotated about actuable member 180, arced surface 170 contacts clamp 190, and through a cam-type action, sandwiches one (or both) of the clamp engagement surfaces 200, 215 between clamp actuating member 150 and wall portion 140, thereby creating a constant engagement surface along the interface between wall portion 140 and engagement surface 200. In another embodiment, the force applied to actuate clamp actuating member 150 into a fully engaged or secured position is translated and mechanically multiplied by the clamping force imparted by one (or both) of engagement surfaces 200, 215 onto wall portion 140. In certain alternative embodiments, engagement surface 200 includes one or more protruding tabs that grip wall portion 140 with greater force per unit area than would be realized by a constant engagement surface having a greater area.

Figure 5A:
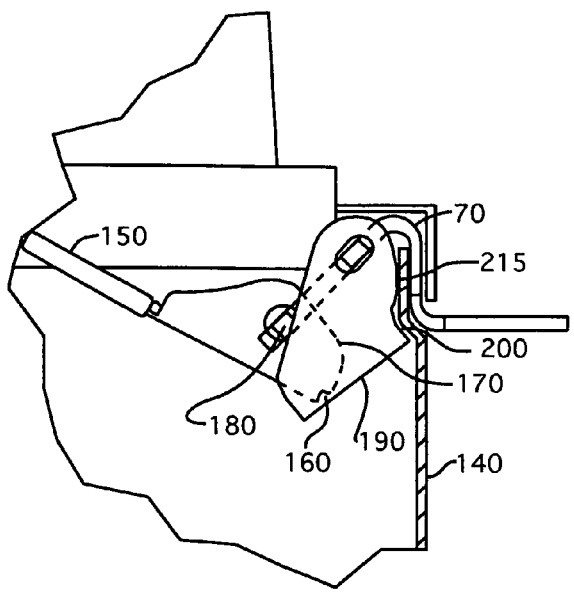
FIG. 5A shows a clamping member disposed in a fully clamped and secured position.

Referring now to the example embodiment of FIG. 5A, the position of clamp actuating member 150 is shown after it has been fully rotated into a secured position. In certain embodiments, clamp actuating member 150 is rotated until it securely fastens into a notched receiving member 160 cut out of arced surface member 170, the notched receiving member 160 providing a tactile indicator of when the clamp actuating member 150 has reached its fully secured position, and when clamping member 70 is securely fastened to a wall portion 140.

According to one embodiment of the invention, the specific location of notched receiving member 160 permits a terminus end of clamp actuating member 150, when fully rotated and secured, to be contained within an enclosed portion of the meter box even after the box cover has been fully installed. On the other hand, if clamp actuating member 150 is not fully rotated and secured into place, a terminus end of clamp actuating member 150 will protrude from the confines of the meter box, and will therefore not permit final installation of the box cover. In alternative embodiments, notched receiving member 160 is disposed so that the clamp actuating member 150, when fully rotated and secured in place, touches the inside surface of a fully installed box door, but does not interfere with its installation.

Figure 5B:
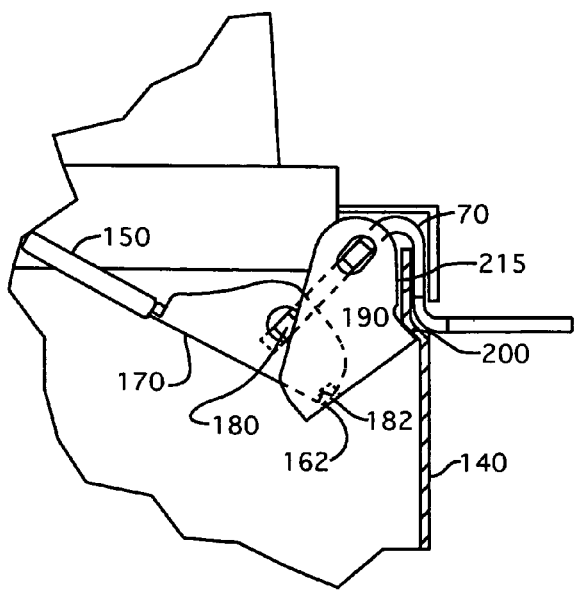
FIG. 5B shows a clamping member, further comprising a stopping member.
Figure 5C:
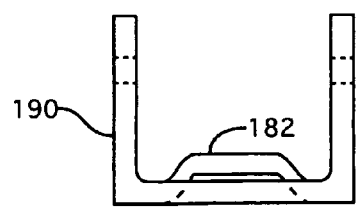
FIG. 5C is a front view of a stopping member disposed on a clamping member.

In other example embodiments, for example, as seen in FIG. 5B, a stopping member 182 is disposed along the bottom of clamp 190, upon which a bottom surface 162 of clamp actuating member 150 rests when the clamp actuating member 150 is in a fully secured position. In another example embodiment, stopping member 182 is disposed along the bottom of clamp 190 so as to prevent the fastening lever 150 from camming over a center of rotation. FIG. 5C shows a side view of another example embodiment of clamp 190, wherein stopping member 182 is stamped into or otherwise formed structurally integral with clamp 190. In other example embodiments, a stopping member 182 is affixed to the clamp 190 prior to installation.

In certain embodiments, clamp actuating member 150 is held in a fully secured position by both a frictional force imposed on notched receiving member 160 when the clamp actuating member 150 is fully turned, and by a spring force inherent in the interaction between the leverage on wall portion 140 imparted by clamp actuating member 150 and clamp 190. In other embodiments, clamp actuating member 150 is held in a fully secured position by means of a separate securing means, for example, by means of a latch or a spring (not shown) disposed between the clamp and the clamp actuating member.

Figure 6A:
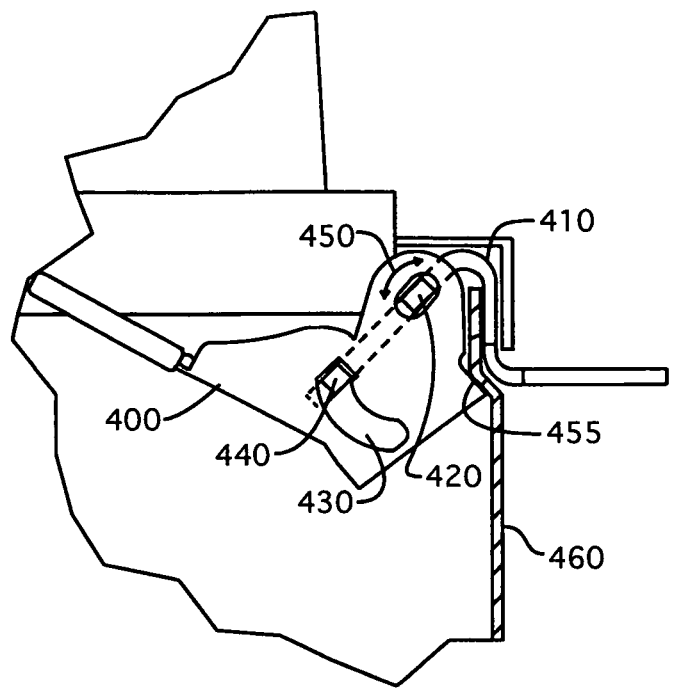
FIG. 6A shows a clamp actuating member according to the present invention.

Turning now to FIG. 6A, a further embodiment of the invention is shown, wherein a clamp actuating member 400 is attached to a clamping member 410, so that the clamp actuating member 400 rotates about a rotational axis established by the position of engagement means 420. A channel 430 is formed on at least one side of clamp actuating member 400, through which guide member 440 travels during actuation of clamp actuation member 400. During installation, clamp actuation member 400 is rotated about engagement member 420 so that bracket 410 will fit over a box wall 460. To secure the base to the wall, clamp actuating member 400 is then rotated in the other direction, back around engagement member 420, toward a secured position, so that surface engagement member 455 sandwiches wall portion 460 between bracket 410 and surface 455.

Figure 6B:
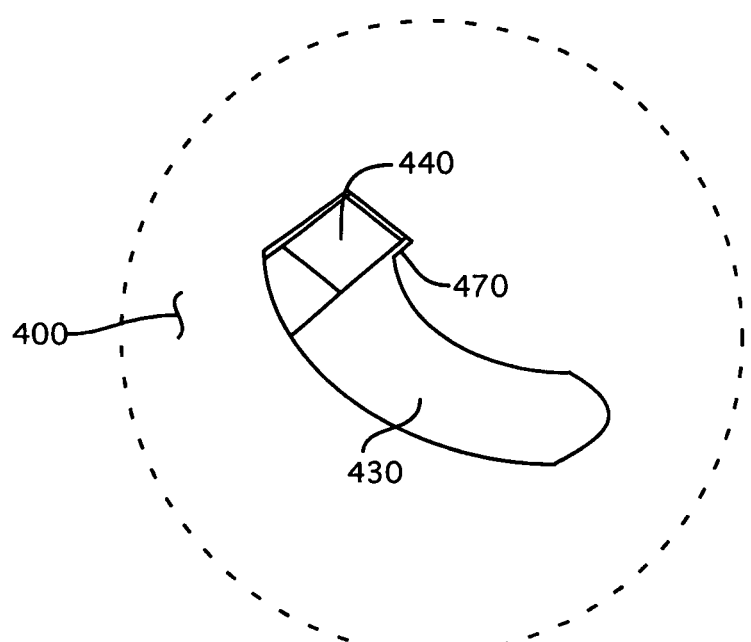
FIG. 6B is a close view of a latching mechanism suitable for use in connection with a clamp actuating member.

Referring now to FIG. 6B, a cut away view of clamp actuating member 400 is provided, wherein a channel 430 and a guide member 440 are shown as non-limiting aspects of the present invention. Clamp actuating member 400 is securely fastened in position after member rotation by means of a stopping shelf 470, upon which rests guide member 440, and also by the inherent spring forces present in the system after clamp actuating member 400 has been fully actuated into a secured position. According to one embodiment of the invention, the desired length and design of channel 430 and stopping shelf 470 is such that the clamp actuating member 400, when secured, is fully contained within an interior space present within the meter box, and does not interfere with installation of a box cover. In another example embodiment, the length and design of channel 430 and stopping shelf 470 are such that the clamp actuating member 400, when fully secured, touches an interior surface of a fully installed box cover, but, again, does not interfere with the cover's installation.

Referring now to FIG. 7A, another exemplary embodiment of the invention is shown, wherein the clamping member 500 is securely fastened to a wall portion 510, and box cover 520 is in a fully installed position. Lock housing 540 is affixed to meter box 530 by means of housing arm 545, and by the interaction between plunger type fastener 550 and fastening shelf 560, which has an aperture through which plunger type fastener 550 passes. In other embodiments, plunger type fastener 550 is held in place after installation by means of a retaining member 555. In various other embodiments, lock housing 540 and plunger type fastener 550 are replaced by a single unitary structure, which locks onto fastening shelf 560, thereby securing box cover 520 to meter box 530. In still other embodiments, housing arm 545 fits into a slot (not shown) formed in the box cover 520.

FIGS. 7B and 7C are isometric views of further embodiments of the invention, wherein clamping member 500 and lock housing 540 are shown prior to installation. Fastening shelf 560 fits into a receiving shelf 570 such that aperture 547 lines up with aperture 565. To lock the two pieces together, a plunger type fastener is aligned with aperture 547, and then a body portion of the fastener is pushed through each of apertures 547, 565 and 580. Referring back to FIG. 7A, in some example embodiments of the invention, plunger type fastener 550 is secured in place inside the lock housing 540 by means of one or more retaining members 555. In still other embodiments, the plunger type fastener 550 is formed structurally integral with the lock housing 540.

In another example embodiment illustrated in FIG. 8, there is shown a ringless type meter box 627 that includes a box cover 620, and a box base 619. Formed around an opening in a central portion of meter box cover 620 is a flange 629. A complementary flange is disposed on meter 628 such that, when meter box cover 620 is installed over and around the head of meter 628, the meter complementary flange is encased by meter box cover flange 629, so that the meter cannot be easily removed from the electrical socket unless the cover 620 is first removed from the meter box base 619.

The meter box cover 620 is typically secured in place by means of a small latch assembly, which functions in structural cooperation with a complementary latch-receiving member disposed on the meter box base 619. The meter box cover 620 is used to secure the meter 628 to the electrical socket (not shown), so that completion of an electrical circuit is ensured, and the meter is reliably prevented from falling out of the meter box socket. The meter box cover 620 also prevents unauthorized persons from tampering with the meter 628. As shown in FIGS. 9 and 14, meter box base 619 comprises wall 623. Wall 623 comprises front flange 621 which extends inwardly from wall 623.

Figure 9A:
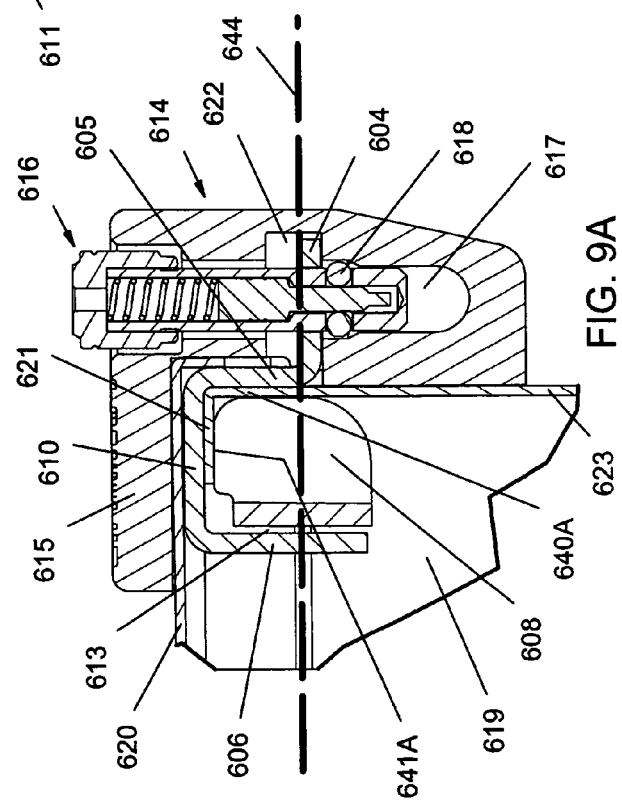
FIG. 9A is a side-section view of the present invention as shown in FIG. 9 which may or may not utilize biasing means and wherein if used, the biasing means may or may not replace, or be used in conjunction with, a flexural member in accord with another possible embodiment of the present invention.

Referring now to FIGS. 8, 9, 9A, 10, and 10A, there is shown watthour meter box 627 wherein lock housing 614 may be utilized for securing meter box cover 620 to meter box base 619. The lock housing 614 is generally comprised of a unitary member incorporating a generally perpendicular flange 615 and multiple apertures or openings which may be interconnected such as 617, 622. Opening 617 may extend into lock housing perpendicular to perpendicular flange 615 and extend through opening or aperture 622, which may, if desired, be generally transverse to opening 617. Aperture 622 preferably opens onto an interior side of lock housing 614 and receives fastening shelf 604 of clamping member 602. As shown in FIGS. 9 and 9A, lock housing 614 may be used in conjunction with clamping member 602 such that cover 620 is held in place between flange 610 of clamping member 602 and perpendicular flange 615 of lock housing 614.

The clamping member 602 is generally comprised of multiple flanges 606, 610, 605 with one of the flanges 606 containing a preferably circular aperture 624 and a fastening shelf 604 that also contains a preferably circular aperture 607. Additional flanges may be added or fewer flanges may be used to accomplish the function as described henceforth.

A locking bracket 601 as shown enlarged in FIGS. 11, 11A, 12, 12A, 13, and 13A may generally comprise clamping member 602 and a fastening lever 603. The fastening lever 603 is generally comprised of multiple flanges 608, 609, 611 with one of the flanges 611 containing a generally circular aperture 625. Additional flanges may be added or fewer flanges may be used to accomplish the function as described henceforth.

As shown in the exploded view of the embodiment of FIG. 12, the fastening lever 603, flexural member 613, and clamping member 602 may be joined through the corresponding apertures 625, 624 with a permanent type fastener 612, which may be a rivet or other type of fastener which allows rotational motion between fastening lever 603, and clamping member 602. Fastener 612 is preferably permanent (but may also be non-permanent and easily removable). Flexural member 613 is partially compressed between the flanges 606 and 611 of clamping member 602 and fastening lever 603. The flexural member is a compressible member which applies a biasing force that biases clamping member 602 and fastening lever 603 preferably away from each other or to separate.

In the embodiment of FIG. 12A, a compression member 630 is adapted to be received by a flange 608 disposed on fastening lever 603. Compression member 630 may be attached to flange 608 by various means, one of which is shown and may comprise a cap. Flange 608 comprises edge 640 and stop surface 641 and is adapted to receive compression member 630 which comprises terminate edge 640A and stop surface 641A. It will be appreciated that edge 640 or terminate edge 640A is a surface although preferably narrow in width and rotates and engages the wall 623 at the same time. Compression member 630 may be wholly or partially comprised of elastomeric material, plastic, or other compressible material. The compressible material may preferably also be resilient so as to permit repeated reuse. The compressible material is also preferably an electrical insulator which reduces any likelihood of contacting electricity which might possibly be present within meter box base 619. Compression member 630 may be used in place of flexural member 613, or in conjunction with it, or with other compression members.

The directly subsequent discussion of assembly and operation of locking bracket 601 onto base 619 of watthour meter box 627 is made using the example of compression member 630, but resilient compression members such as flexural member 613, or other resilient compression members discussed hereinafter, or compression members such as lobe 734 (e.g., See FIG. 17) which may or may not be resilient, may be utilized to provide a secure fit of locking bracket (e.g., 601) onto base (e.g., 619). Compression members may be used with or without each other.

Referring to FIG. 13A, the locking bracket 601 is installed onto the base 619 of the watthour meter box 627 in the following manner: The fastening lever 603 is first rotated to an "open" position as shown with the flange 609 of the fastening lever 603 in a generally perpendicular position to the flange 610 of the clamping member 602. The locking bracket is moved toward the wall 623 of the meter box base 619, shown by movement arrow "A", allowing the front flange 621 of the meter box base 619 to pass between the compression member 630 disposed on flange 608 of the fastening lever 603 and the fastening shelf 604 of the clamping member 602. The locking bracket 601 is then lowered onto the front flange 621 of the watthour meter box base 619 shown by movement arrow "B" until the front flange 621 of the meter box base 619 is in contact with the flange 610 of the clamping member 602.

Figure 10A:
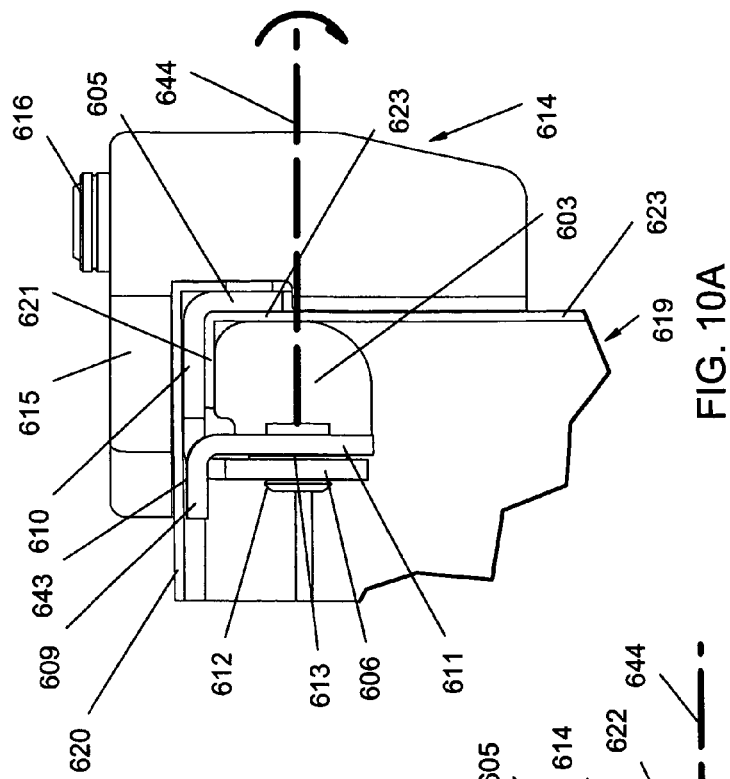
FIG. 10A is a side-section view of the present invention as shown in FIG. 10 which may or may not utilize biasing means and wherein, if used, the biasing means may or may not replace, or be used in conjunction with, a flexural member in accord with another possible embodiment of the present invention.
Figure 14A:
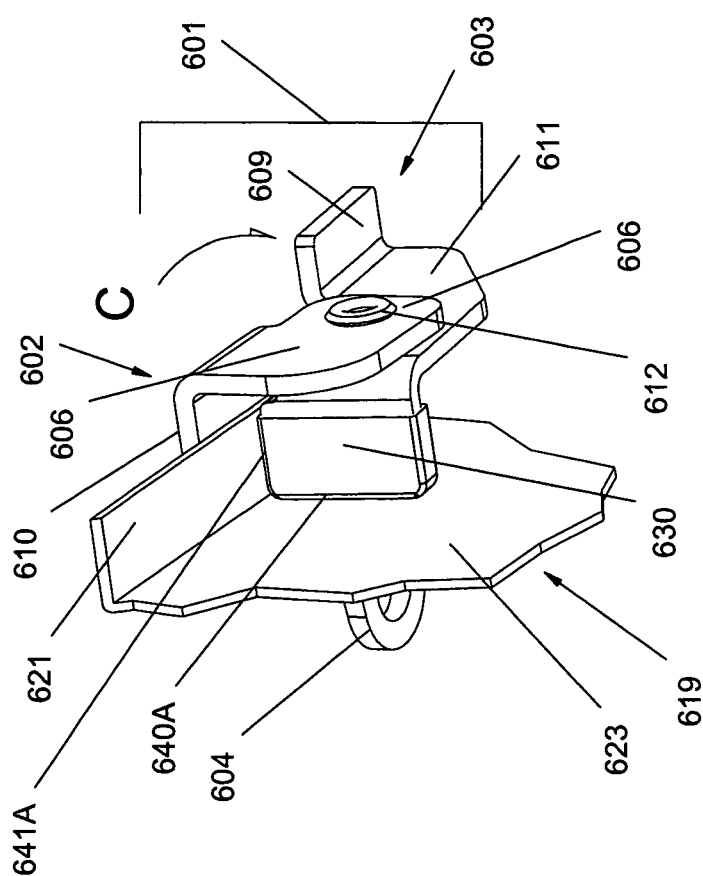
FIG. 14A is a side-section view of the present invention as shown in FIG. 15 which may or may not utilize biasing means such as a compression member and wherein, if used, the biasing means may or may not replace, or be used in conjunction with, a flexural member in accord with another possible embodiment of the present invention.

Now referring to FIG. 14A, which shows a view on the other side of that shown in FIG. 13A, the installer bears on flange 609 of the fastening lever 603 causing the fastening lever 603 to rotate to a "closed position", shown by movement arrow "C". As shown in FIG. 10A, it will be seen that rotation of fastening lever 603 is around axis of rotation 644, which may be generally transverse, perpendicular, or orthogonal to wall 623. In this embodiment, axis of rotation 644 is orthogonal to wall 623, parallel to box cover 620, perpendicular to flange 605, and parallel to a plane of fastening shelf 604. In this embodiment, rotation of fastening lever 603 is in a plane parallel to a plane defined by what might be called the y-axis and the z-axis. In this case, the x-axis would be coincident with axis of rotation 644. Fastening lever 603 would extend into and out of the page in the z-axis. It will be understood that perpendicular or orthogonal is meant to include roughly or approximately perpendicular or orthogonal such that some variation within between about one to ten degrees may occur.

However, axis of rotation 644 could be angled away from wall 623 e.g., by providing that axis of rotation 644 is at an angle with respect to the z-axis and the x-axis while still perpendicular to the y-axis such as by bending flange 606 inwardly toward the interior of meter box base 619. In this case, axis of rotation 644 may still be perpendicular with respect to an axial direction x. In this case, when fastening lever 603 is rotated, then terminate end engagement surface 640A does not come into contact with wall 623 until near the end of rotation, which occurs when stop surface 641A engages the underside of front flange 621. Thus, in this embodiment, at least one axial direction of axis of rotation 644 is perpendicular to the y-axis and/or wall 623.

As the lever 603 is rotated, the compressible member 630, due to the limited space defined by a lower surface of front flange 621 and wall 623 of the watthour meter box base 619 and the terminate end 640A of the flange 608, will compress. The compression of compressible member 630 ensures a "secure feel" and a tighter fit of the locking bracket to the watthour meter box base. The installer continues to rotate the fastening lever 603 until stop surface 641A engages the inside surface of front flange 621. In a preferred embodiment, the flange 609 of the fastening lever 603 is in a generally parallel position to the flange 610 of the clamping member 602 when stop surface 641A engages the inside surface of front flange 621. The front flange 621 of the meter box base 619 is now trapped between the compression member 630 disposed on flange 608 of the fastening lever 603, and the flange 610 of the clamping member 602. As shown in FIG. 15, when meter box lid 620 is installed onto the meter box base 619, then the upper surface 643 of flange 609 may be prevented from movement and/or may be biasingly engaged with the inner surface of box lid 620. The compression member 630, in one example embodiment, provides a bias force between locking bracket 601 and wall 623 and front flange 621 and also frictional engagement which acts to hold the locking bracket 601 securely in place for subsequent attachment of lock housing 614.

Referring to FIG. 16, the meter box lid 620 is then installed onto the meter box base 619. The meter box lid 620 covers the flange 609 of the fastening lever 603 and the flange 610 of the clamping member 602.

Once the lid 620 is in place, the aperture 622 in the lock housing 614 is aligned with the fastening shelf 604 of the clamping member 602. The lock housing 614 is then slid onto the fastening shelf 604 of the clamping member 602, shown by movement arrow "D" in FIG. 13A. The locking shaft 616 is then inserted through the aperture 617 in the lock housing 614, shown by movement arrow "E" which is perpendicular to the fastening shelf 604. Shown in FIGS. 9, 9A, 11, and 11A, the locking balls 618 of the locking shaft 616 become trapped as they pass though the aperture 607 of the fastening shelf 604; this prevents the removal of the locking shaft 616 from the lock housing 614. Fastening shelf 604 may have tapering sides to permit easier insertion or guiding of fastening shelf 604 into aperture 622 of locking shaft 616. Aperture 622 is preferably sized to mate with the sides of fastening shelf 604 at least near flange 605 so as to prevent sideways movement of clamping member 602.

The perpendicular flange 615 of the lock housing 614 prevents meter box lid 620 removal; consequently the meter box lid 620 prevents the fastening lever 603 from rotating to the "open position". The fastening lever 603, the clamping member 602, the connector 612, lock housing 614, the lid 620, and the meter box base 619, interact together to prevent the removal of both the meter box lid 620 and the entire locking apparatus.

Referring back to FIGS. 9, 10, 11, 12, 13, 14, and 15 when flexural member 613 is utilized, the compressive biasing force so produced between clamping member 602 and fastening lever 603 results in a biasing being applied against both sides of wall 623 of the meter box base 619. On the inner side of wall 623, the periphery 640 of flange 608 of fastening lever 603 is urged into engagement with wall 623.

On the outer surface of wall 623, inner surface of flange 605 of clamping bracket 602 is biased toward engagement with the outer side of wall 623. Fastening lever 603 is rotated until stop surface 641 engages the inner surface of front flange 621. In a preferred embodiment, the flange 609 of the fastening lever 603 is in a generally parallel position to the flange 610 of the clamping member 602 when stop surface 641 engages the inside surface of front flange 621. The front flange 621 of the meter box base 619 is now trapped between the compression member 630 disposed on flange 608 of the fastening lever 603, and the flange 610 of the clamping member 602. As shown in FIG. 15, when meter box lid 620 is installed onto the meter box base 619, then the upper surface 643 of flange 609 may be prevented from movement and/or may be engaged with the inner surface of box lid 620. If it is desired to provide biased engagement of flange 609 with inner surface of box lid 620, then compression member 630 may be utilized and/or flange 609 may be provided with resilient compression material that may be in the form of a cap such as the cap shape of compressible member 630, or resilient compression material can otherwise be applied to flange 609.

In an alternate embodiment, compressible member 630 may or may not be used. In this alternate embodiment, a different compressible member, comprising a different shape, material, or attachment means as shown in the illustrations, may be disposed on the inside of flange 605 of the clamping member 602. In this embodiment, as the fastening lever 603 is rotated to a "closed position" as previously described, the flange 623 of the watthour meter box base 619 becomes trapped between the terminate end of flange 608 disposed on the fastening lever 603, and the compressible member, performing a similar function as previously described.

In another alternate embodiment, one or more compressible members may or may not be used. Assuming a compressible material is not used, in this embodiment, as the fastening lever 603 is rotated to a "closed position" as previously described, the wall 623 of the meter box base 619 becomes trapped between the terminate end 640 of flange 608 disposed on the fastening lever 603, and the flange 605 of the clamping member 602.

Figure 17:
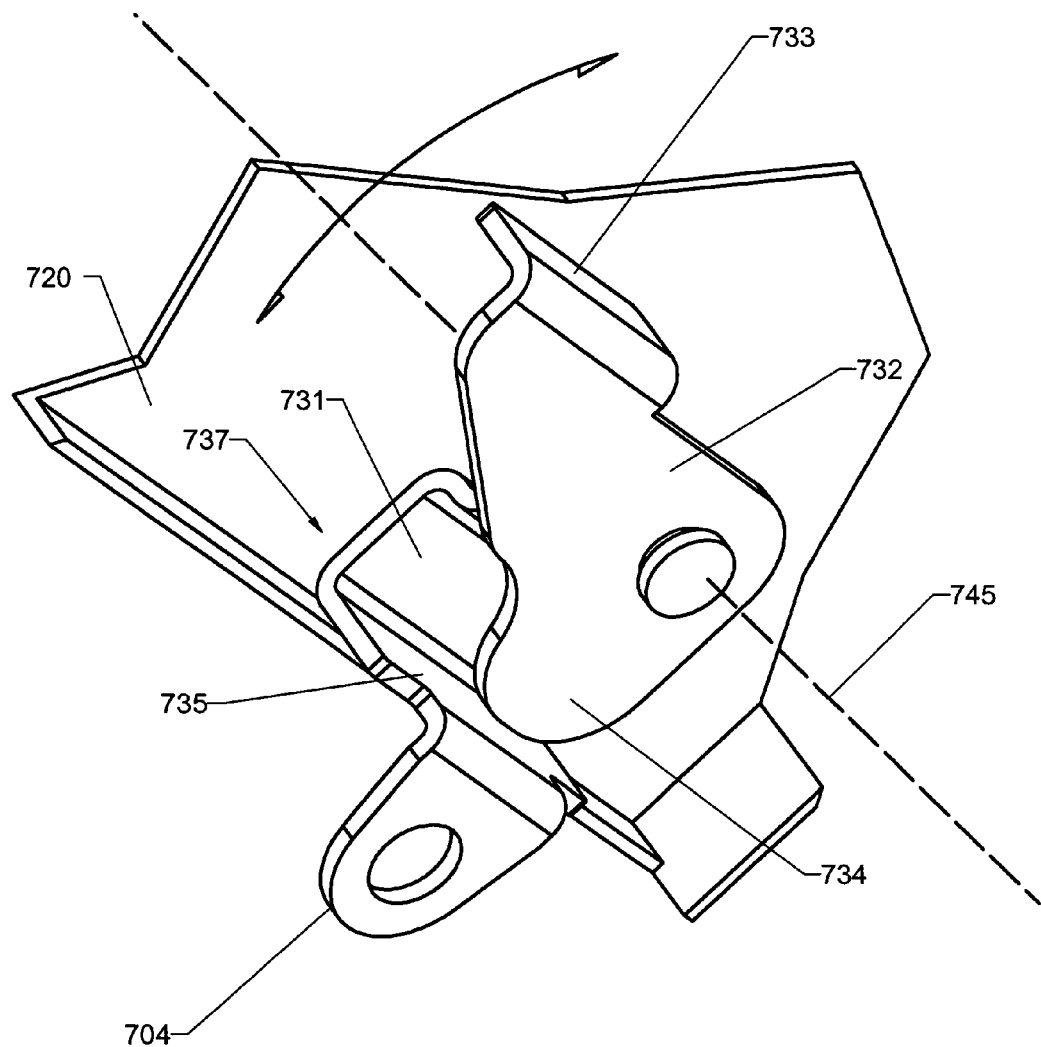
FIG. 17 is a perspective view of an alternate embodiment of the present invention showing the various components of the locking bracket in the "closed" position.
Figure 18:
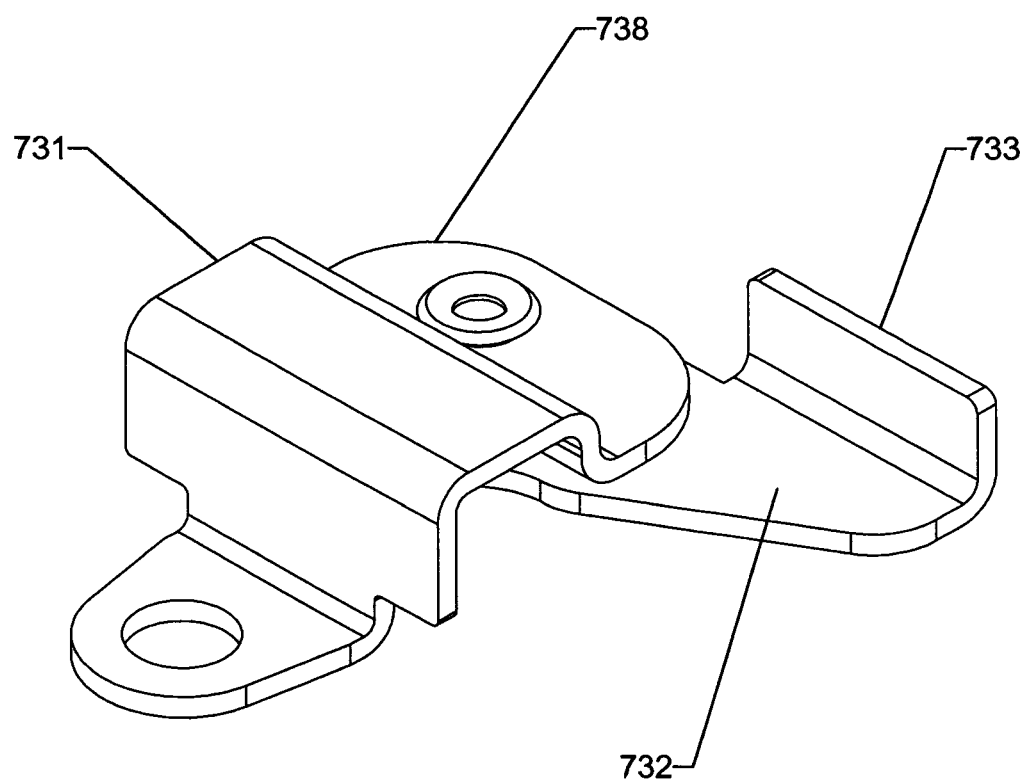
FIG. 18 is a perspective view of an alternate embodiment of the present invention showing the various components of the locking bracket in the "closed" position.
Figure 19:
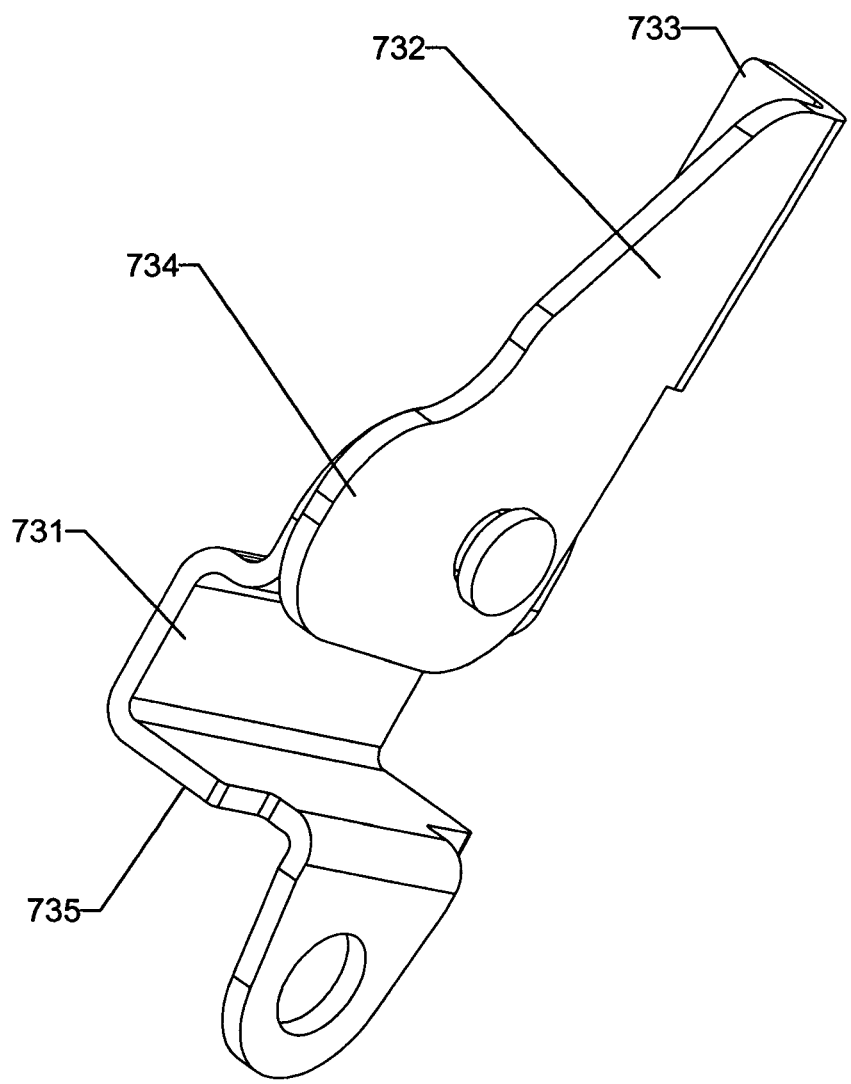
FIG. 19 is a perspective view of an alternate embodiment of the present invention showing the various components of the locking bracket in the "open" position.

In another alternate embodiment, shown in FIGS. 17-19, a compressible member may not be used. In this embodiment, the lever 732 comprises an engaging lobe 734. The lever 732 rotates in a generally parallel relationship to flange 738 of clamping member 737. Thus, axis of rotation 745 may be generally orthogonal to metal box cover 720, parallel to wall 723, parallel to flange 735 which engages an outer surface of wall 723, and perpendicular to the plane of fastening shelf 704. Flange 731 is in a generally perpendicular relationship to flange 735 of the clamping bracket 737. As the fastening lever 732 is rotated to a "closed position" as shown in FIGS. 17, 18, the wall 723 of the meter box base 719 becomes trapped between the engaging lobe 734 disposed on the fastening lever 732, and the flange 735 of the clamping member 737.

In another example embodiment of the lever end 609 shown in FIG. 10 is in functional cooperation with a portion 615 of a lock housing mounted to a portion of the clamping member such that the lock prevents rotation of the lever to an open position if the lid is pried upwardly.

In another example embodiment of the apparatus the lever end 609 is in functional cooperation with a portion of a meter box lid 620 such that the lid prevents rotation of the lever to an open position.

In another example embodiment of the apparatus shown in FIGS. 10 and 13 the lever end 609 is at least partially outside the interior of the meter box in a mounting position and at least partially inside the interior of the meter box in a locked position.

Figure 1:
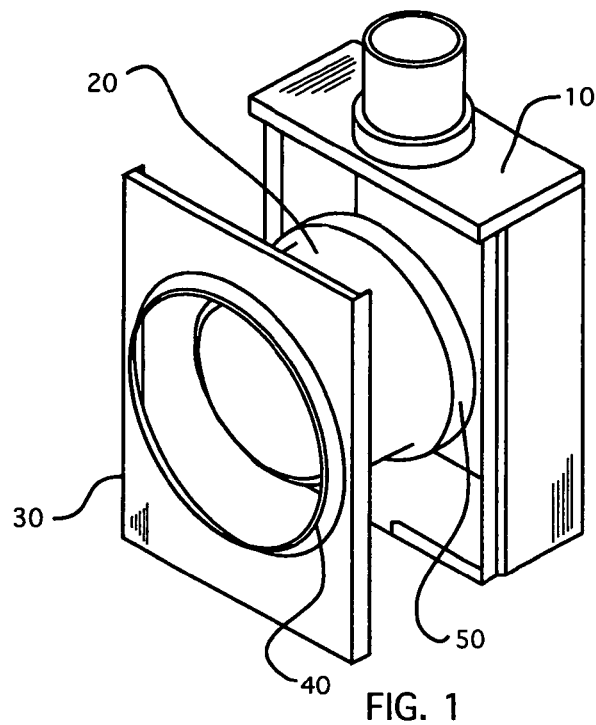
FIG. 1 is an exploded view of a known ringless meter socket box, including a watthour meter and a meter box lid.

Another example embodiment of the apparatus further comprises the meter box. For example, the meter box may have the configuration as shown in FIGS. 1, 8, or that of various other meter boxes suitable for use with the invention.

Another example embodiment of the apparatus further comprises a locking structure (e.g., 614 or other types of locking structures adaptable for use with the invention) for functional cooperation with the clamping member (see, for example, FIG. 11, item 602) for securing a meter box lid to a meter box base.

Various other example embodiments provide an apparatus that may be adapted for use on a utility service enclosure generally. Such a utility service enclosure may have various configurations, shapes and sizes and be used in the electric utility industry (e.g., a meter box) as well as in the gas, water, cable, TV utility industries or in other utility industries.

Figure 20:
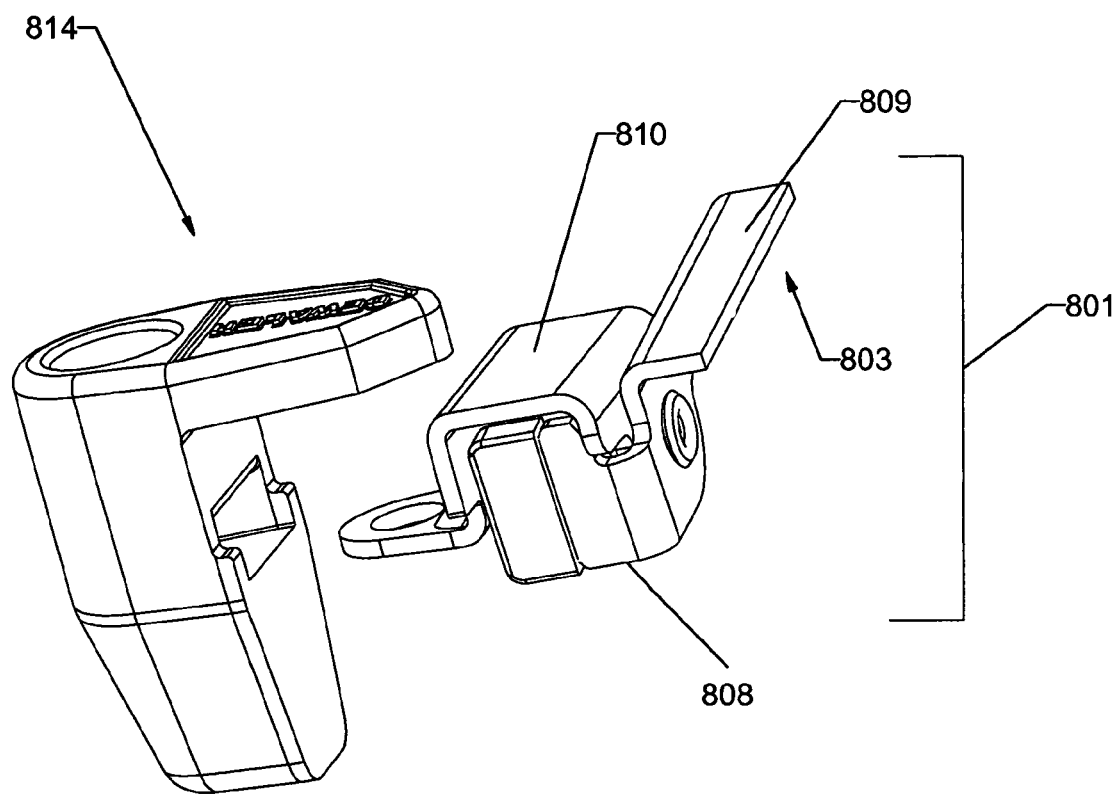
FIG. 20 is a perspective view of another alternate embodiment of the present invention showing the various components of the locking bracket in the "closed" position.

The example embodiment shown in FIG. 20 comprises locking bracket 801 and receiver housing 814. The locking bracket 801 is shown in a "closed" mode and is adapted to be attached or mounted to a structural portion of an enclosure generally (which could be any type of container, compartment, box-like structure or enclosure having a cover, access panel or other securable structure which can be secured with respect to a structural portion of the enclosure) or, for example, a utility enclosure (not shown). The locking bracket 801 may comprise a fastening structure 803 and mounting structure 810. The receiver housing 814 can be mounted generally on an outer structural portion of an enclosure (as well as internal portions) in such a way that the receiver housing 814 cooperatively receives and secures (with, for example, a barrel lock or other locking device) the locking bracket 801 so as to secure one structural portion of the enclosure to another portion of the enclosure (such as a cover or an access panel). In one example embodiment, the locking bracket 801 is mounted and attached to a flanged wall of the enclosure so as to be mounted substantially in the interior of an enclosure, wherein an enclosure lid (not shown) may be positioned over an opening of the enclosure. The receiver housing 814 is configured to cooperatively receive a portion of the locking bracket 801 to secure the lid in place with a suitable locking device.

Another example embodiment for securing a cover of an enclosure comprises a locking bracket, wherein the locking bracket further comprises an engagement member and a mounting member. The engagement member preferably comprises a biased engagement flange which is biased to engage a structural portion of the enclosure. In one embodiment, the locking bracket also generally comprises a fastening shelf connected to the mounting member, with the fastening shelf comprising a first securing means. A lock housing is also preferably used and configured to receive at least a portion of the fastening shelf. In this way the lock housing is used with the locking bracket such that the cover is held in place between the mounting member and at least a portion of the lock housing.

In an example embodiment, the locking bracket may also comprise an engagement member connected to an opposing flange, with the engagement member biased to engage, for example, a portion of an enclosure wall (e.g., such as a meter box side wall). In an example embodiment, the engagement member may comprise a biased engagement flange in cooperation with an opposing flange, wherein the opposing flange is preferably adapted to be disposed outside the enclosure (e.g., see FIG. 11, item 605; FIG. 4A, item 130), with the biased engagement flange being biased so as to engage an interior surface of an enclosure (e.g., such as a enclosure or meter box side wall). In this way, the locking bracket may be effectively affixed to a portion of an enclosure, with or without camming or lever structures. The locking bracket preferably further comprises a fastening shelf connected to the opposing member. The fastening shelf is disposed outside the enclosure and comprises a first securing means. A cover or access panel may be disposed over the locking bracket in such a way that the biased engagement flange is positioned in the interior of the enclosure and the opposing member is disposed on the outside of the enclosure. A lock housing comprising a second securing means is adapted to receive at least a portion of the fastening shelf. The second securing means is adapted to receive a locking device (e.g., such as a barrel lock) in such a way as to secure the lock housing to the locking bracket. In another embodiment, other structures or features of the other embodiments disclosed herein may also be included with the locking brackets and lock housings above.

In one example embodiment, the biased engagement flange may be configured to engage the inner ledge of the side wall of an enclosure such as a watthour meter box (e.g., see FIG. 2, items 66 or 68; FIG. 4A, item 140), or to engage a flange or bottom wall (e.g., see FIG. 14, items 621, 623).

In another embodiment, a locking bracket may further comprise a reinforcing clip member adapted to be mounted over at least a portion of the opposing flange and preferably at least a portion of an inner flange (such as, in one example embodiment, a biased engagement flange) with the inner flange being configured in functional cooperation with the opposing flange to inhibit undesired flexing of the inner flange and/or the opposing flange as well as to reinforce the side wall engagement to prevent tampering or unwanted removal of the locking bracket. The reinforcing clip may also be configured for slidable engagement with at least some portion of the opposing flange and/or inner flange to inhibit undesired flexing of the inner flange and/or the opposing flange.

The design described does not limit the scope of the invention; the number of flanges may change, or various components may be added or removed to the above-described concept to aid in improved security and operation.

The foregoing disclosure and description of the invention is illustrative and explanatory of presently preferred embodiments of the invention and variations thereof, and it will be appreciated by those skilled in the art, that various changes in the design, organization, order of operation, means of operation, equipment structures and location, methodology, the use of mechanical equivalents, such as different types of fasteners and locking devices than as illustrated whereby different steps may be utilized, as well as in the details of the illustrated construction or combinations of features of the various elements may be made without departing from the spirit of the invention. As well, the drawings are intended to describe various concepts of the invention so that the presently preferred embodiments of the invention will be plainly disclosed to one of skill in the art but are not intended to be manufacturing level drawings or renditions of final products and may include simplified conceptual views as desired for easier and quicker understanding or explanation of the invention. As well, the relative size and arrangement of the components may be varied from that shown and the invention still operate well within the spirit of the invention as described hereinbefore and in the appended claims. Thus, various changes and alternatives may be used that are contained within the spirit of the invention.

Accordingly, the foregoing specification is provided for illustrative purposes only, and is not intended to describe all possible aspects of the present invention. It will be appreciated by those skilled in the art, that various changes in the ordering of steps, ranges, interferences, spacings, hardware, and/or attributes and parameters, as well as in the details of the illustrations or combinations of features of the methods and system discussed herein, may be made without departing from the spirit of the invention. Moreover, while the invention has been shown and described in detail with respect to several exemplary embodiments, those of ordinary skill in the art will appreciate that changes to the description, and various other modifications, omissions and additions may also be made without departing from either the spirit or scope thereof.

What is claimed is:

1. A method for securing a box cover to a meter box, said method comprising:
    disposing a clamping member over a wall of said meter box, the wall comprising an upper portion and a lower portion, the wall having an angled portion disposed between the upper portion and lower portion of the wall, wherein said clamping member comprises a clamp, a clamp actuating member, and a fastening shelf having a first securing means, and wherein said clamping member is adapted to engage at least just the inside surface of the upper portion of the wall above the angled portion;
    disposing a lock housing in functional cooperation with said clamping member, wherein said lock housing comprises a second securing means; and
    securing said clamping member using said lock housing.

2. The method of claim 1, further comprising disposing said fastening shelf so that said first securing means comprises a body portion of said fastening shelf through which an aperture has been formed.

3. The method of claim 2, further comprising disposing said lock housing so that said second securing means comprises said lock housing through which an aperture has been formed.

4. The method of claim 3, further comprising disposing said fastening shelf and said lock housing so that said first securing means and said second securing means comprise approximately cylindrical apertures.

5. The method of claim 1, further comprising disposing a plunger type fastener.

6. The method of claim 5, further comprising disposing said plunger type fastener, and then securing said plunger type fastener by means of a retaining member.

7. The method of claim 1, further comprising rotating said clamp actuating member about a rotational axis established by disposition of an engagement member disposed on said body portion of said clamping member.

8. The method of claim 7, further comprising:
    delivering an input force to one end of said clamp actuating member so that said clamp actuating member rotates about a rotational axis established by disposition of said engagement member on said clamping member; and
    translating said input force into a mechanical clamping force that is greater than the input force.

9. The method of claim 1, further comprising disposing said clamp actuating member having a tactile feedback indicator to indicate when said clamp actuating member has been fully rotated into a secure position.

10. The method of claim 1, further comprising disposing said clamp between said clamp actuating member and said fastening shelf.

11. The method of claim 10, further comprising disposing said clamp having a stopping member, wherein said stopping member stops a rotational sweep of said clamp actuating member after said clamp actuating member is disposed in a fully secured position.

12. The method of claim 10, further comprising disposing said clamp imparting a spring force that holds said clamp actuating member in a fully secured position.

13. An apparatus for securing a box cover to a meter box, said apparatus comprising:
    a clamping member adapted to be disposed over a wall of said meter box, the wall comprising an upper portion and a lower portion, the wall having an angled portion disposed between the upper portion and lower portion of the wall, wherein said clamping member comprises a clamp, a clamp actuating member, and a fastening shelf having a first securing means, and wherein said clamping member is adapted to engage at least just the inside surface of the upper portion of the wall above the angled portion;
    a lock housing in functional cooperation with said clamping member, wherein said lock housing comprises a second securing means; and
    a securing member to secure said clamping member using said lock housing.

14. The apparatus of claim 13, wherein said fastening shelf is disposed so that said first securing means comprises a body portion of said fastening shelf through which an aperture has been formed.

15. The apparatus of claim 14, wherein said lock housing is disposed so that said second securing means comprises said lock housing through which an aperture has been formed.

16. The apparatus of claim 15, wherein said fastening shelf and said lock housing are adapted so that said first securing means and said second securing means comprise approximately cylindrical apertures.

17. The apparatus of claim 14, further comprising a plunger type fastener.

18. The apparatus of claim 17, wherein said plunger type fastener is secured by means of a retaining member.

19. The apparatus of claim 13, further comprising said clamp actuating member being rotated about a rotational axis established by disposition of an engagement member disposed on said body portion of said clamping member.

20. The apparatus of claim 19, wherein one end of said clamp actuating member is configured to receive an input force so that said clamp actuating member rotates about a rotational axis established by disposition of said engagement member on said clamping member; and
    wherein said input force is translated into a mechanical clamping force that is greater than the input force.

21. The apparatus of claim 13, wherein said clamp actuating member comprises a tactile feedback indicator to indicate when said clamp actuating member has been fully rotated into a secure position.

22. The apparatus of claim 13, wherein said clamp is disposed between said clamp actuating member and said fastening shelf.

23. The apparatus of claim 22, wherein said clamp comprises a stopping member, wherein said stopping member stops a rotational sweep of said clamp actuating member after said clamp actuating member is disposed in a fully secured position.

24. The apparatus of claim 22, wherein said claim is configured to impart a spring force that hold said clamp actuating member in a fully secured position.

* * * * *